(12) United States Patent
Tatematsu et al.

(10) Patent No.: US 12,323,122 B2
(45) Date of Patent: Jun. 3, 2025

(54) FILTER CIRCUIT AND MULTILAYERED FILTER DEVICE

(71) Applicant: TDK CORPORATION, Tokyo (JP)

(72) Inventors: Masahiro Tatematsu, Tokyo (JP);
Shuhei Sawaguchi, Tokyo (JP); Yuta Ashida, Tokyo (JP); Tetsuzo Goto, Tokyo (JP); Yoshinori Matsumaru, Tokyo (JP); Shigemitsu Tomaki, Tokyo (JP); Longfei Yi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 296 days.

(21) Appl. No.: 18/162,155

(22) Filed: Jan. 31, 2023

(65) Prior Publication Data
US 2023/0253945 A1 Aug. 10, 2023

(30) Foreign Application Priority Data
Feb. 4, 2022 (JP) .................................. 2022-016356

(51) Int. Cl.
*H03H 7/01* (2006.01)
*H01F 27/28* (2006.01)
(Continued)

(52) U.S. Cl.
CPC ....... *H03H 7/0115* (2013.01); *H01F 27/2804* (2013.01); *H01F 27/292* (2013.01);
(Continued)

(58) Field of Classification Search
CPC ......... H03H 7/0115; H03H 2001/0085; H03H 7/09; H03H 7/1775; H03H 7/42; H03H 7/1708; H03H 7/38; H03H 7/1758; H03H 7/1766; H03H 7/075; H03H 7/463; H03H 7/422; H03H 7/0161; H03H 11/1208;
(Continued)

(56) References Cited

U.S. PATENT DOCUMENTS

| | | | |
|---|---|---|---|
| 2006/0284705 A1* | 12/2006 | Kamgaing | H03H 7/0161 333/175 |
| 2008/0136560 A1* | 6/2008 | Bavisi | H03H 7/1783 333/175 |

(Continued)

FOREIGN PATENT DOCUMENTS

| | | |
|---|---|---|
| JP | H03-274814 A | 12/1991 |
| JP | 2002-374139 A | 12/2002 |

(Continued)

OTHER PUBLICATIONS

Translation of Apr. 22, 2025 Office Action issued in Japanese Application No. 2022-016356.

*Primary Examiner* — John W Poos
(74) *Attorney, Agent, or Firm* — Oliff PLC

(57) ABSTRACT

A filter circuit includes a pair of balanced input ports, a pair of balanced output ports, first and second resonators provided in parallel between the pair of balanced input ports and the pair of balanced output ports in a circuit configuration, a first capacitor connected in parallel to the first resonator, and a second capacitor connected in parallel to the second resonator. The first and second resonators are magnetically coupled to each other and electrically connected to each other. The first and second capacitors are not electrically connected to ground.

22 Claims, 21 Drawing Sheets

(51) Int. Cl.
  *H01F 27/29* (2006.01)
  *H01G 4/012* (2006.01)
  *H01G 4/30* (2006.01)
(52) U.S. Cl.
  CPC ............... *H01G 4/012* (2013.01); *H01G 4/30* (2013.01); *H03H 7/0161* (2013.01); *H01F 2027/2809* (2013.01)
(58) Field of Classification Search
  CPC .......... H03H 7/425; H03H 9/545; H03H 7/12; H03H 11/04; H03H 11/32; H03H 3/007; H03H 7/06; H03H 7/427; H03H 9/0095; H03H 9/706; H03H 2003/0071; H03H 7/0123; H03H 7/461; H03H 7/482; H03H 9/0571; H03H 9/54; H03H 9/56; H03H 9/58; H03H 9/589; H03H 9/6433; H03H 9/70; H03H 9/725; H01P 5/10; H01P 1/20381; H01P 1/203; H01P 1/2135; H01P 5/18; H01P 5/185; H01P 7/082
  See application file for complete search history.

(56) References Cited

U.S. PATENT DOCUMENTS

| | | |
|---|---|---|
| 2010/0188171 A1 | 7/2010 | Mohajer-Iravani et al. |
| 2013/0033336 A1 | 2/2013 | Tanaka |
| 2017/0310296 A1* | 10/2017 | Hahn ..................... H01G 4/232 |
| 2019/0260343 A1 | 8/2019 | Shiokawa |

FOREIGN PATENT DOCUMENTS

| | | |
|---|---|---|
| JP | 2005-333392 A | 12/2005 |
| JP | 2013-034041 A | 2/2013 |
| WO | 2018/092442 A1 | 5/2018 |

* cited by examiner

FILTER CIRCUIT AND MULTILAYERED FILTER DEVICE

CROSS REFERENCE TO RELATED APPLICATIONS

This application claims the benefit of Japanese Priority Patent Application No. 2022-016356 filed on Feb. 4, 2022, the entire contents of which are incorporated herein by reference.

BACKGROUND OF THE INVENTION

1. Field of the Invention

The present invention relates to a balanced filter circuit and a multilayered filter device including the balanced filter circuit.

2. Description of the Related Art

One of electronic components used in a communication apparatus is a band-pass filter including a plurality of resonators. Each of the plurality of resonators includes, for example, an inductor and a capacitor. As the band-pass filter, a balanced band-pass filter including a pair of balanced output ports is known. The balanced band-pass filter includes a band-pass filter including one unbalanced input port and a band-pass filter including a pair of balanced input ports.

JP 2002-374139 A discloses a balanced LC filter including a pair of balanced input terminals and a pair of balanced output terminals. The balanced LC filter includes two resonance coils and four resonance capacitors. Of the four resonance capacitors, two resonance capacitors are connected to both ends of one resonance coil, and the other two resonance capacitors are connected to both ends of the other resonance coil. Each of the four resonance capacitors is connected to the ground.

A band-pass filter that is used for a small-sized communication apparatus in particular is required to be downsized. One known example of a band-pass filter suitable for downsizing is a band-pass filter using a stack including a plurality of dielectric layers and a plurality of conductor layers stacked together, as described in JP 2002-374139 A. However, since the balanced LC filter of JP 2002-374139 A includes the four resonance capacitors connected to the ground, there is a problem in that the number of conductor layers to form the four resonance capacitors may be relatively increased.

The above problem applies generally to balanced filter circuits, not only to the balanced band-pass filters.

SUMMARY OF THE INVENTION

An object of the present invention is to provide a balanced filter circuit that can be downsized, and a balanced multilayered filter device that can be downsized.

A filter circuit according to the present invention includes a pair of balanced input ports, a pair of balanced output ports, a first resonator and a second resonator provided in parallel between the pair of balanced input ports and the pair of balanced output ports in a circuit configuration, a first capacitor connected in parallel to the first resonator, and a second capacitor connected in parallel to the second resonator. The first resonator and the second resonator are magnetically coupled to each other and electrically connected to each other. The first capacitor and the second capacitor are not electrically connected to ground.

In the filter circuit according to the present invention, the first resonator and the second resonator may not be electrically connected to the ground.

In the filter circuit according to the present invention, the first resonator may include a first inductor. The second resonator may include a second inductor. Each of the first inductor and the second inductor may include a first part, a second part, and a third part being connected in series. The first inductor and the second inductor may be electrically connected to each other in at least one aspect of a first aspect in which one end of the second part of the first inductor and one end of the second part of the second inductor are electrically connected to each other, or a second aspect in which the other end of the second part of the first inductor and the other end of the second part of the second inductor are electrically connected to each other.

The filter circuit according to the present invention may further include a third resonator provided in parallel to the first resonator, between the pair of balanced input ports and the first resonator in the circuit configuration.

The filter circuit according to the present invention may further include a fourth resonator provided in parallel to the second resonator, between the pair of balanced output ports and the second resonator in the circuit configuration.

The filter circuit according to the present invention may further include two input inductors electrically connected to the pair of balanced input ports.

The filter circuit according to the present invention may further include two output inductors electrically connected to the pair of balanced output ports.

The filter circuit according to the present invention may have the circuit configuration in which a part including the pair of balanced input ports and the first resonator in the circuit configuration and a part including the pair of balanced output ports and the second resonator in the circuit configuration are configured to be symmetrical with respect to a center between the first resonator and the second resonator.

The filter circuit according to the present invention may have the circuit configuration in which a part including one port of the pair of balanced input ports and one port of the pair of balanced output ports in the circuit configuration and a part including another port of the pair of balanced input ports and another port of the pair of balanced output ports in the circuit configuration are configured to be symmetrical with respect to the first resonator and the second resonator.

A multilayered filter device according to the present invention includes a pair of balanced input terminals, a pair of balanced output terminals, a first resonator and a second resonator provided in parallel between the pair of balanced input terminals and the pair of balanced output terminals in a circuit configuration, a first capacitor connected in parallel to the first resonator, a second capacitor connected in parallel to the second resonator, and a stack for integrating the pair of balanced input terminals, the pair of balanced output terminals, the first resonator, the second resonator, the first capacitor, and the second capacitor, the stack including a plurality of dielectric layers stacked together. The first resonator and the second resonator are magnetically coupled to each other and electrically connected to each other in the stack. The first capacitor and the second capacitor are not electrically connected to ground.

In the multilayered filter device according to the present invention, the first resonator and the second resonator may not be electrically connected to the ground.

In the multilayered filter device according to the present invention, the first resonator may include a first inductor wound around a first axis. The second resonator may include a second inductor wound around a second axis. In this case, an opening of the first inductor and an opening of the second inductor may face each other. In this case, each of the first inductor and the second inductor may include a first through hole line, a second through hole line, and a conductor layer portion connecting the first through hole line and the second through hole line. Each of the first through hole line and the second through hole line may be formed with two or more through holes being connected in series. In this case, the multilayered filter device according to the present invention may further include an inductor conductor layer arranged in the stack. The inductor conductor layer may include the conductor layer portion of the first inductor, the conductor layer portion of the second inductor, and a connection portion connecting the conductor layer portion of the first inductor and the conductor layer portion of the second inductor.

The multilayered filter device according to the present invention may further include a third resonator provided in parallel to the first resonator, between the pair of balanced input terminals and the first resonator in the circuit configuration. In this case, the third resonator may include a third inductor. The third inductor may include a third inductor conductor layer arranged in the stack. The third inductor conductor layer may be arranged at a position different form the first resonator in a stacking direction of the plurality of dielectric layers.

The multilayered filter device according to the present invention may further include a fourth resonator provided in parallel to the second resonator, between the pair of balanced output terminals and the second resonator in the circuit configuration. In this case, the fourth resonator may include a fourth inductor. The fourth inductor may include a fourth inductor conductor layer arranged in the stack. The fourth inductor conductor layer may be arranged at a position different from the second resonator in a stacking direction of the plurality of dielectric layers.

The multilayered filter device according to the present invention may further include two input inductors electrically connected to the pair of balanced input terminals.

The multilayered filter device according to the present invention may further include two output inductors electrically connected to the pair of balanced output terminals.

In the multilayered filter device according to the present invention, a shape and an arrangement of a plurality of conductors constituting a part including the pair of balanced input terminals, the first resonator, and the first capacitor in the stack may be symmetrical with a shape and an arrangement of a plurality of conductors constituting a part including the pair of balanced output terminals, the second resonator, and the second capacitor in the stack, with respect to a first imaginary plane passing between the first resonator and the second resonator and being in parallel to a stacking direction of the plurality of dielectric layers.

In the multilayered filter device according to the present invention, a plurality of conductors constituting a part including one terminal of the pair of balanced input terminals and one terminal of the pair of balanced output terminals in the stack may be arranged symmetrically with a part including the other terminal of the pair of balanced input terminals and the other terminal of the pair of balanced output terminals in the stack, with respect to a second imaginary plane crossing the first resonator and the second resonator and being in parallel to a stacking direction of the plurality of dielectric layers.

In the filter circuit according to the present invention and the multilayered filter device according to the present invention, the first resonator and the second resonator are magnetically coupled to each other and electrically connected to each other. The first capacitor connected in parallel to the first resonator and the second capacitor connected in parallel to the second resonator are not electrically connected to the ground. With this, according to the present invention, the balanced filter circuit that can be downsized and the multilayered filter device that can be downsized can be implemented.

Other and further objects, features and advantages of the present invention will appear more fully from the following description.

DETAILED DESCRIPTION OF THE PREFERRED EMBODIMENTS

First Embodiment

Figure 1:
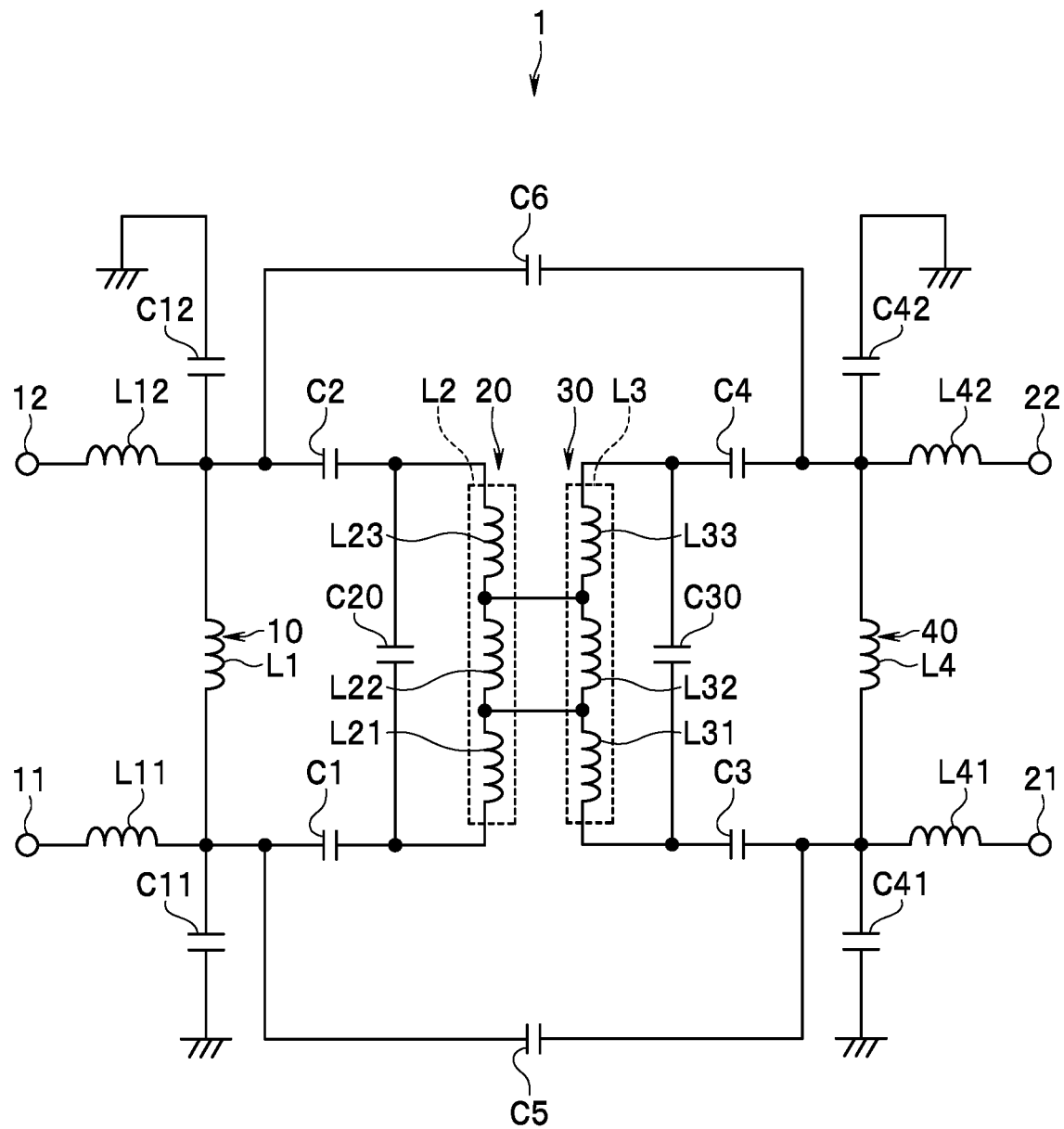
FIG. 1 is a circuit diagram showing a circuit configuration of a filter circuit according to a first embodiment of the present invention.

Embodiments of the present invention will be described below in detail with reference to the drawings. First, with reference to FIG. 1, a configuration of a filter circuit 1 according to a first embodiment of the present invention will be described. FIG. 1 is a circuit diagram showing a circuit configuration of the filter circuit 1. The filter circuit 1 is configured to function as a balanced band-pass filter that selectively allows a balanced signal of a frequency in a predetermined passband to pass.

The filter circuit 1 according to the present embodiment includes a pair of balanced input ports 11 and 12, a pair of balanced output ports 21 and 22, and a resonator 10, a resonator 20, a resonator 30, and a resonator 40 provided between the pair of balanced input ports 11 and 12 and the pair of balanced output ports 21 and 22 in the circuit configuration. The resonators 10, 20, 30, and 40 may each be a half wavelength resonator. Note that, in the present application, the expression "in the (a) circuit configuration" is used not to indicate not a layout in a physical configuration but to indicate a layout in a circuit diagram.

In the filter circuit 1, a first balanced element signal is input to the balanced input port 11, and a second balanced element signal is input to the balanced input port 12. The first balanced element signal and the second balanced element signal constitute a balanced input signal. In the filter circuit 1, a third balanced element signal is output from the balanced output port 21, and a fourth balanced element signal is output from the balanced output port 22. The third balanced element signal and the fourth balanced element signal constitute a balanced output signal.

The resonators 20 and 30 are provided in parallel between the pair of balanced input ports 11 and 12 and the pair of balanced output ports 21 and 22 in the circuit configuration. The resonators 20 and 30 are magnetically coupled to each other and electrically connected to each other. The resonators 20 and 30 are not electrically connected to the ground. The resonator 20 corresponds to a "first resonator" in the present invention. The resonator 30 corresponds to a "second resonator" in the present invention.

The filter circuit 1 further includes a capacitor C20 connected in parallel to the resonator 20, and a capacitor C30 connected in parallel to the resonator 30. The capacitors C20 and C30 are not electrically connected to the ground. The capacitor C20 corresponds to a "first capacitor" in the present invention. The capacitor C30 corresponds to a "second capacitor" in the present invention.

The resonator 10 is provided in parallel to the resonator 20 between the pair of balanced input ports 11 and 12 and the resonator 20 in the circuit configuration. The resonator 10 corresponds to a "third resonator" in the present invention.

The resonator 40 is provided in parallel to the resonator 30 between the pair of balanced output ports 21 and 22 and the resonator 30 in the circuit configuration. The resonator 40 corresponds to a "fourth resonator" in the present invention.

The filter circuit 1 further includes two input inductors L11 and L12 electrically connected to the pair of balanced input ports 11 and 12, and two output inductors L41 and L42 electrically connected to the pair of balanced output ports 21 and 22. The two input inductors L11 and L12 are provided between the pair of balanced input ports 11 and 12 and the resonator 10 in the circuit configuration. The two output inductors L41 and L42 are provided between the pair of balanced output ports 21 and 22 and the resonator 40 in the circuit configuration.

The filter circuit 1 further includes capacitors C1, C2, C3, C4, C5, C6, C11, C12, C41, and C42.

With reference to FIG. 1, a connection relationship between a plurality of components constituting the filter circuit 1 will be described below in detail. The resonator 10 includes an inductor L1. One end of the input inductor L11 is connected to one end of the inductor L1. One end of the input inductor L12 is connected to the other end of the inductor L1. The other end of the input inductor L11 is connected to the balanced input port 11. The other end of the input inductor L12 is connected to the balanced input port 12.

One end of the capacitor C11 is connected to one end of the inductor L1. One end of the capacitor C12 is connected to the other end of the inductor L1. The other end of each of the capacitors C11 and C12 is connected to the ground.

The resonator 20 includes an inductor L2. The inductor L2 includes a first part L21, a second part L22, and a third part L23 connected in series. One end of the capacitor C1 is connected to one end of each of the inductor L1 and the input inductor L11. The other end of the capacitor C1 is connected to one end of the first part L21. One end of the capacitor C2 is connected to the other end of the inductor L1 and one end of the input inductor L12. The other end of the capacitor C2 is connected to one end of the third part L23.

One end of the capacitor C20 is connected to one end of the first part L21. The other end of the capacitor C20 is connected to one end of the third part L23.

The resonator 30 includes an inductor L3. The inductor L3 includes a first part L31, a second part L32, and a third part L33 connected in series. A connection point between the first part L21 and the second part L22 of the inductor L2 is connected to a connection point between the first part L31 and the second part L32 of the inductor L3. A connection point between the second part L22 and the third part L23 of the inductor L2 is connected to a connection point between the second part L32 and the third part L33 of the inductor L3.

One end of the capacitor C30 is connected to one end of the first part L31. The other end of the capacitor C30 is connected to one end of the third part L33.

The resonator 40 includes an inductor L4. One end of the output inductor L41 is connected to one end of the inductor L4. One end of the output inductor L42 is connected to the other end of the inductor L4. The other end of the output inductor L41 is connected to the balanced output port 21. The other end of the output inductor L42 is connected to the balanced output port 22.

One end of the capacitor C41 is connected to one end of the inductor L4. One end of the capacitor C42 is connected to the other end of the inductor L4. The other end of each of the capacitors C41 and C42 is connected to the ground.

One end of the capacitor C3 is connected to one end of the first part L31. The other end of the capacitor C3 is connected to one end of each of the inductor L4 and the output inductor L41. One end of the capacitor C4 is connected to one end of the third part L33. The other end of the capacitor C4 is connected to the other end of the inductor L4 and one end of the output inductor L42.

One end of the capacitor C5 is connected to one end of each of the inductor L1 and the input inductor L11. The other end of the capacitor C5 is connected to one end of each of the inductor L4 and the output inductor L41. One end of the capacitor C6 is connected to the other end of the inductor L1 and one end of the input inductor L12. The other end of the capacitor C6 is connected to the other end of the inductor L4 and one end of the output inductor L42.

Here, of the filter circuit 1, in the circuit configuration, a part including the pair of balanced input ports 11 and 12, the resonator 10 (inductor L1), the resonator 20 (inductor L2), the input inductors L11 and L12, and the capacitors C1, C2, C11, C12, and C20 is referred to as a first part. Of the filter circuit 1, in the circuit configuration, a part including the pair of balanced output ports 21 and 22, the resonator 30 (inductor L3), the resonator 40 (inductor L4), the output inductors L41 and L42, and the capacitors C3, C4, C30, C41, and C42 is referred to as a second part. The filter circuit 1 has a circuit configuration in which the first part and the second part are configured to be symmetrical with respect to the center between the resonator 20 (inductor L2) and the resonator 30 (inductor L3). In other words, in the filter circuit 1, in the circuit configuration, the plurality of inductors and the plurality of capacitors included in the first part and the plurality of inductors and the plurality of capacitors included in the second part are arranged to be symmetrical with respect to the center between the resonator 20 and the resonator 30.

Of the filter circuit 1, in the circuit configuration, a part including the balanced input port 11, the balanced output port 21, the input inductor L11, the output inductor L41, and the capacitors C1, C3, C5, C11, and C41 is referred to as a third part. Of the filter circuit 1, in the circuit configuration, a part including the balanced input port 12, the balanced output port 22, the input inductor L12, the output inductor L42, and the capacitors C2, C4, C6, C12, and C42 is referred to as a fourth part. The filter circuit 1 has a circuit configuration in which the third part and the fourth part are configured to be symmetrical with respect to the resonator 20 (in particular, the second part L22 of the inductor L2) and the resonator 30 (in particular, the second part L32 of the inductor L3). In other words, in the filter circuit 1, in the circuit configuration, the plurality of inductors and the plurality of capacitors included in the third part and the plurality of inductors and the plurality of capacitors included in the fourth part are arranged to be symmetrical with respect to the resonator 20 and the resonator 30.

Figure 2:
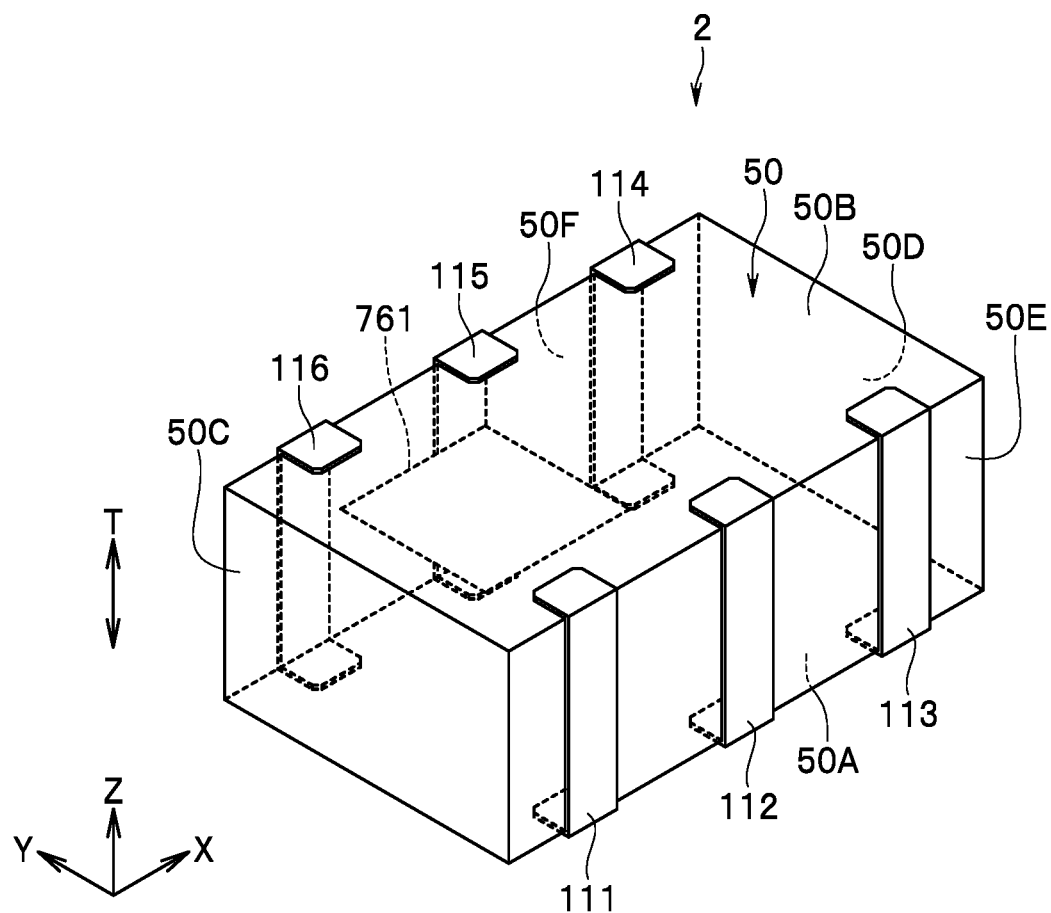
FIG. 2 is a perspective view showing an external appearance of a multilayered filter device according to the first embodiment of the present invention.

Next, with reference to FIG. 2, a configuration of a multilayered filter device (hereinafter simply referred to as a filter device) 2 according to the present embodiment will be described. FIG. 2 is a perspective view showing an external appearance of the filter device 2. The filter device 2 is a balanced filter device including the balanced filter circuit 1.

The filter device 2 includes the components of the filter circuit 1 described with reference to FIG. 1, and a stack 50 for integrating the components of the filter circuit 1. The stack 50 includes a plurality of dielectric layers stacked together and a plurality of conductor layers and a plurality of through holes formed in the plurality of dielectric layers.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, an X direction, a Y direction, and a Z direction are defined as shown in FIG. 2. The X direction, the Y direction, and the Z direction are orthogonal to one another. In the present embodiment, a direction parallel to the stacking direction T is defined as the Z direction. A direction opposite to the X direction is defined as a −X direction, a direction opposite to the Y direction is defined as a −Y direction, and a direction opposite to the Z direction is defined as a −Z direction.

As shown in FIG. 2, the bottom surface 50A is located at the end of the stack 50 in the −Z direction. The top surface 50B is located at the end of the stack 50 in the Z direction. The shape of each of the bottom surface 50A and the top surface 50B is a rectangular shape that is long in the X direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter device 2 further includes terminals 111, 112, 113, 114, 115, and 116. Each of the terminals 111 to 113 is arranged to extend from the top surface 50B to the bottom surface 50A via the side surface 50E. The terminals 111 to 113 are arranged in this order in the X direction. Each of the terminals 114 to 116 is arranged to extend from the top surface 50B to the bottom surface 50A via the side surface 50F. The terminals 114 to 116 are arranged in this order in the −X direction.

Of the terminal 111 to 116, two terminals are a pair of balanced input terminals corresponding to the pair of balanced input ports 11 and 12, and other two terminals are a pair of balanced output terminals corresponding to the pair of balanced output ports 21 and 22. In the present embodiment, the terminals 111 and 116 may be the pair of balanced input terminals, or the terminals 113 and 114 may be the pair of balanced input terminals. When the terminals 111 and 116 are the pair of balanced input terminals, the terminals 113 and 114 may be the pair of balanced output terminals. When the terminals 113 and 114 are the pair of balanced input terminals, the terminals 111 and 116 may be the pair of balanced output terminals.

The following description will be given by taking an example of a case in which the terminals 111 and 116 are the pair of balanced input terminals, and the terminals 113 and 114 are the pair of balanced output terminals. In the following description, the terminals 111 and 116 are also respectively referred to as balanced input terminals 111 and 116, and the terminals 113 and 114 are also respectively referred to as balanced output terminals 113 and 114. The filter device 2 includes the pair of balanced input terminals 111 and 116 and the pair of balanced output terminals 113 and 114.

The balanced input terminal 111 corresponds to the balanced input port 11, and the balanced input terminal 116 corresponds to the balanced input port 12. The balanced output terminal 113 corresponds to the balanced output port 21, and the output terminal 114 corresponds to the balanced output port 22. Each of the terminals 112 and 115 is connected to the ground.

Next, with reference to FIG. 3A to FIG. 9B, an example of the plurality of dielectric layers and the plurality of conductor layers constituting the stack 50 will be described. In the present example, the stack 50 includes twenty-six dielectric layers stacked together. The twenty-six dielectric layers are hereinafter referred to as first to twenty-sixth dielectric layers in the order from bottom to top. The first to twenty-sixth dielectric layers are denoted by the reference numerals 51 to 76, respectively.

Figure 3A:
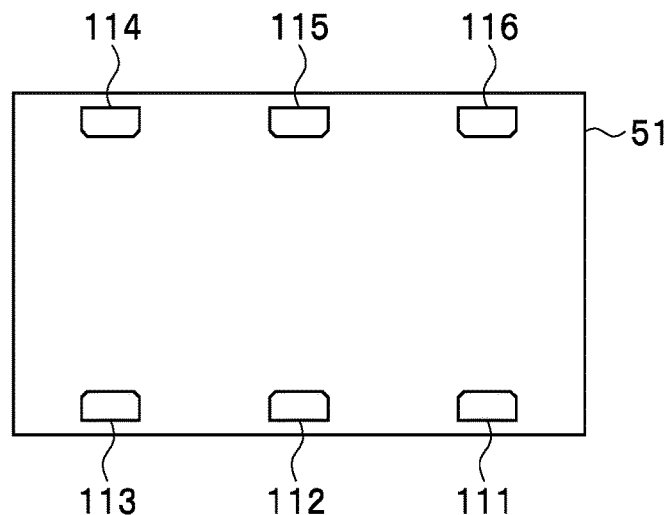
FIG. 3A to FIG. 3C are explanatory diagrams showing respective patterned surfaces of first to third dielectric layers of a stack of the multilayered filter device according to the first embodiment of the present invention.

FIG. 3A shows a patterned surface of the first dielectric layer 51. A part of each of the terminal 111 to 116 is formed on the patterned surface of the dielectric layer 51.

Figure 3B:
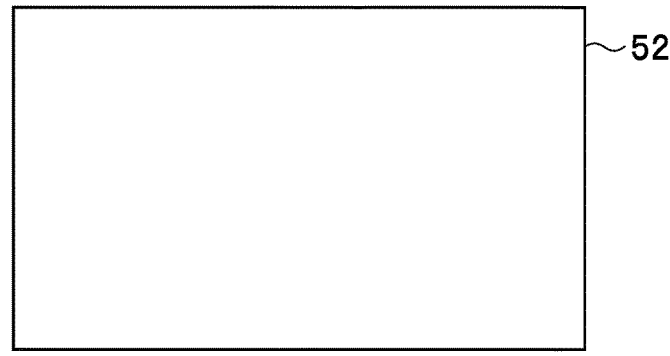

FIG. 3B shows a patterned surface of the second dielectric layer 52. Neither conductor layers nor through holes are formed in the dielectric layer 52.

Figure 3C:
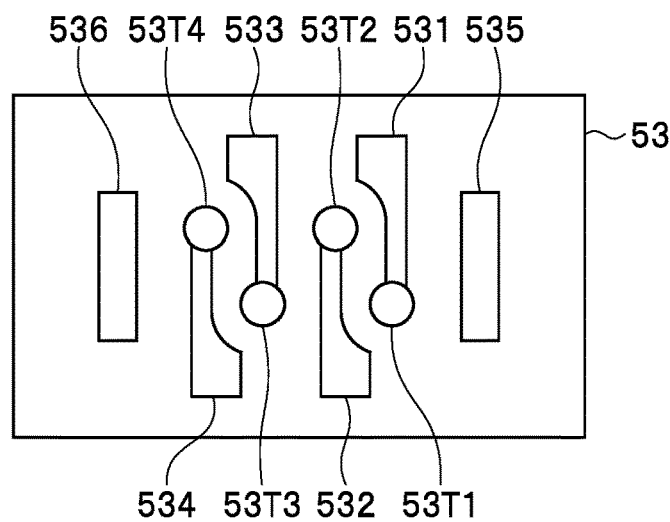

FIG. 3C shows a patterned surface of the third dielectric layer 53. Conductor layers 531, 532, 533, 534, 535, and 536 are formed on the patterned surface of the dielectric layer 53. Through holes 53T1, 53T2, 53T3, and 53T4 are formed in the dielectric layer 53. The through holes 53T1 to 53T4 are connected to the conductor layers 531 to 534, respectively.

Figure 4A:
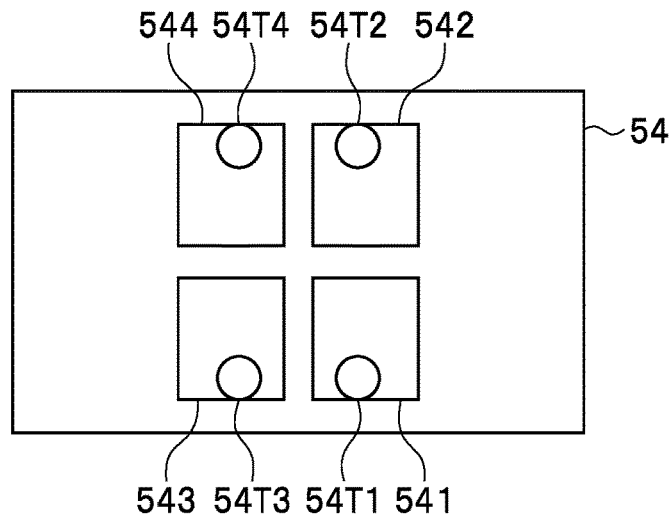
FIG. 4A to FIG. 4C are explanatory diagrams showing respective patterned surfaces of fourth to sixth dielectric layers of the stack of the multilayered filter device according to the first embodiment of the present invention.

FIG. 4A shows a patterned surface of the fourth dielectric layer 54. Conductor layers 541, 542, 543, and 544 are formed on the patterned surface of the dielectric layer 54. Through holes 54T1, 54T2, 54T3, and 54T4 are formed in the dielectric layer 54. The through hole 53T1 formed in the dielectric layer 53 and the through hole 54T1 are connected to the conductor layer 541. The through hole 53T2 formed in the dielectric layer 53 and the through hole 54T2 are connected to the conductor layer 542. The through hole 53T3 formed in the dielectric layer 53 and the through hole 54T3 are connected to the conductor layer 543. The through hole 53T4 formed in the dielectric layer 53 and the through hole 54T4 are connected to the conductor layer 544.

Figure 4B:
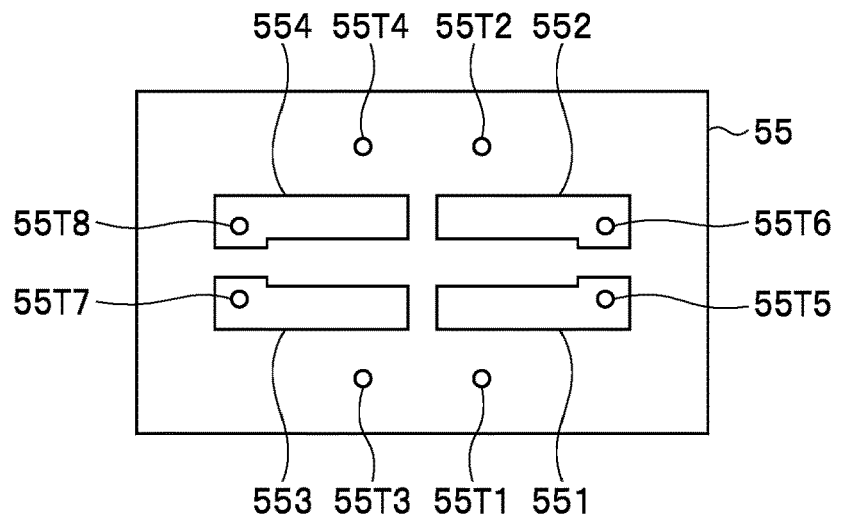

FIG. 4B shows a patterned surface of the fifth dielectric layer 55. Conductor layers 551, 552, 553, and 554 are formed on the patterned surface of the dielectric layer 55. Through holes 55T1, 55T2, 55T3, 55T4, 55T5, 55T6, 55T7, and 55T8 are formed in the dielectric layer 55. The through holes 54T1 to 54T4 formed in the dielectric layer 54 are connected to the through holes 55T1 to 55T4, respectively. The through holes 55T5 to 55T8 are connected to the conductor layers 551 to 554, respectively.

Figure 4C:
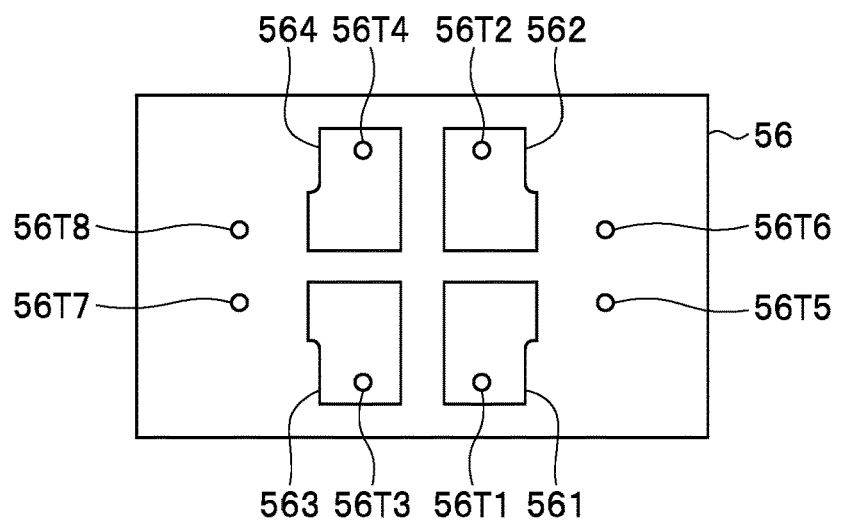

FIG. 4C shows a patterned surface of the sixth dielectric layer 56. Conductor layers 561, 562, 563, and 564 are formed on the patterned surface of the dielectric layer 56. Through holes 56T1, 56T2, 56T3, 56T4, 56T5, 56T6, 56T7, and 56T8 are formed in the dielectric layer 56. The through hole 55T1 formed in the dielectric layer 55 and the through hole 56T1 are connected to the conductor layer 561. The through hole 55T2 formed in the dielectric layer 55 and the through hole 56T2 are connected to the conductor layer 562. The through hole 55T3 formed in the dielectric layer 55 and the through hole 56T3 are connected to the conductor layer 563. The through hole 55T4 formed in the dielectric layer 55 and the through hole 56T4 are connected to the conductor layer 564. The through holes 55T5 to 55T8 formed in the dielectric layer 55 are connected to the through holes 56T5 to 56T8, respectively.

Figure 5A:
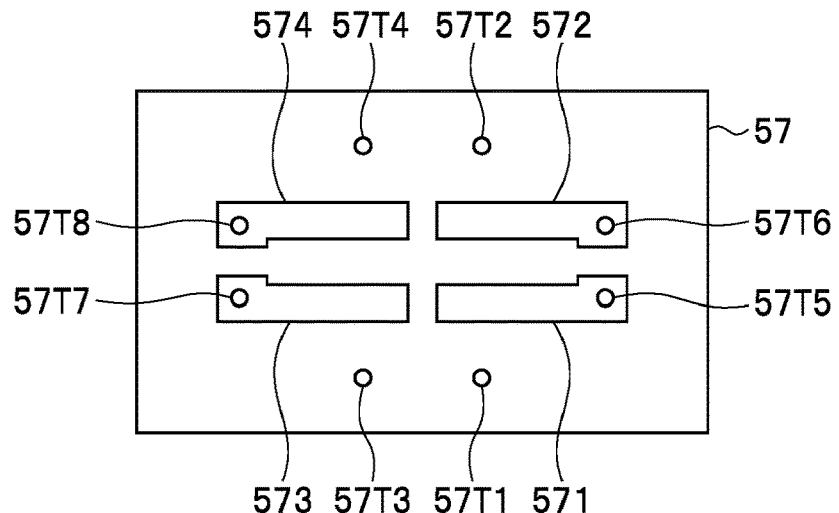
FIG. 5A to FIG. 5C are explanatory diagrams showing respective patterned surfaces of seventh to ninth dielectric layers of the stack of the multilayered filter device according to the first embodiment of the present invention.

FIG. 5A shows a patterned surface of the seventh dielectric layer 57. Conductor layers 571, 572, 573, and 574 are formed on the patterned surface of the dielectric layer 57. Through holes 57T1, 57T2, 57T3, 57T4, 57T5, 57T6, 57T7, and 57T8 are formed in the dielectric layer 57. The through holes 56T1 to 56T4 formed in the dielectric layer 56 are connected to the through holes 57T1 to 57T4, respectively. The through hole 56T5 formed in the dielectric layer 56 and the through hole 57T5 are connected to the conductor layer 571. The through hole 56T6 formed in the dielectric layer 56 and the through hole 57T6 are connected to the conductor layer 572. The through hole 56T7 formed in the dielectric layer 56 and the through hole 57T7 are connected to the conductor layer 573. The through hole 56T8 formed in the dielectric layer 56 and the through hole 57T8 are connected to the conductor layer 574.

Figure 5B:
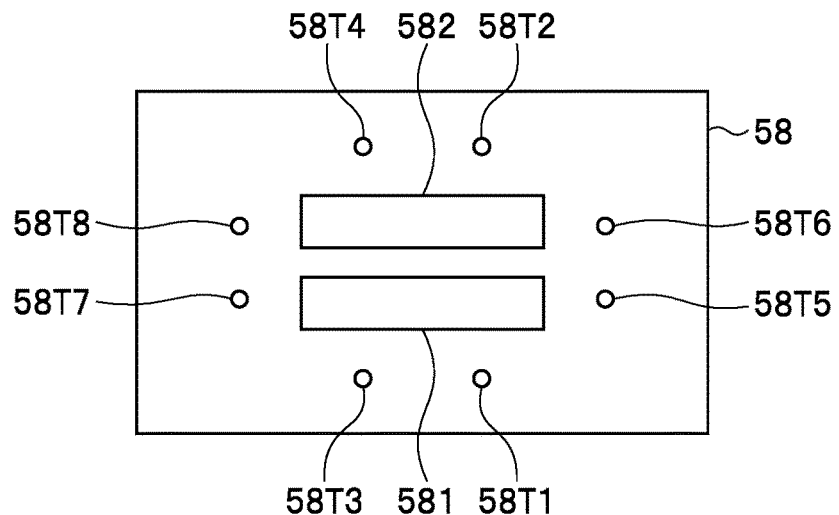

FIG. 5B shows a patterned surface of the eighth dielectric layer 58. Conductor layers 581 and 582 are formed on the patterned surface of the dielectric layer 58. Through holes 58T1, 58T2, 58T3, 58T4, 58T5, 58T6, 58T7, and 58T8 are formed in the dielectric layer 58. The through holes 57T1 to 57T8 formed in the dielectric layer 57 are connected to the through holes 58T1 to 58T8, respectively.

Figure 5C:
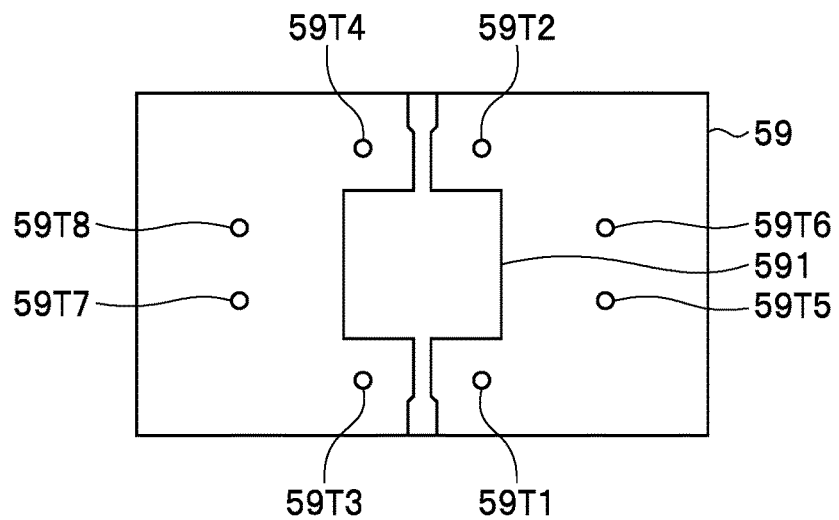

FIG. 5C shows a patterned surface of the ninth dielectric layer 59. A conductor layer 591 is formed on the patterned surface of the dielectric layer 59. The conductor layer 591 is connected to the terminals 112 and 115 (see FIG. 2). Through holes 59T1, 59T2, 59T3, 59T4, 59T5, 59T6, 59T7, and 59T8 are formed in the dielectric layer 59. The through holes 58T1 to 58T8 formed in the dielectric layer 58 are connected to the through holes 59T1 to 59T8, respectively.

Figure 6A:
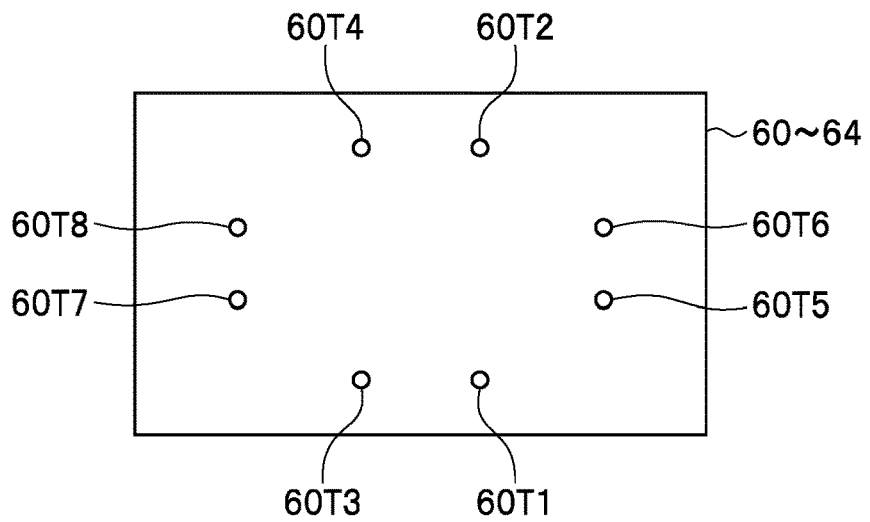
FIG. 6A is an explanatory diagram showing a patterned surface of tenth to fourteenth dielectric layers of the stack of the multilayered filter device according to the first embodiment of the present invention.

FIG. 6A shows a patterned surface of each of the tenth to fourteenth dielectric layers 60 to 64. Through holes 60T1, 60T2, 60T3, 60T4, 60T5, 60T6, 60T7, and 60T8 are formed in each of the dielectric layers 60 to 64. The through holes 59T1 to 59T8 formed in the dielectric layer 59 are connected to the through holes 60T1 to 60T8 in the dielectric layer 60, respectively. In the dielectric layers 60 to 64, vertically adjacent through holes denoted by the same reference numerals are connected to each other.

Figure 6B:
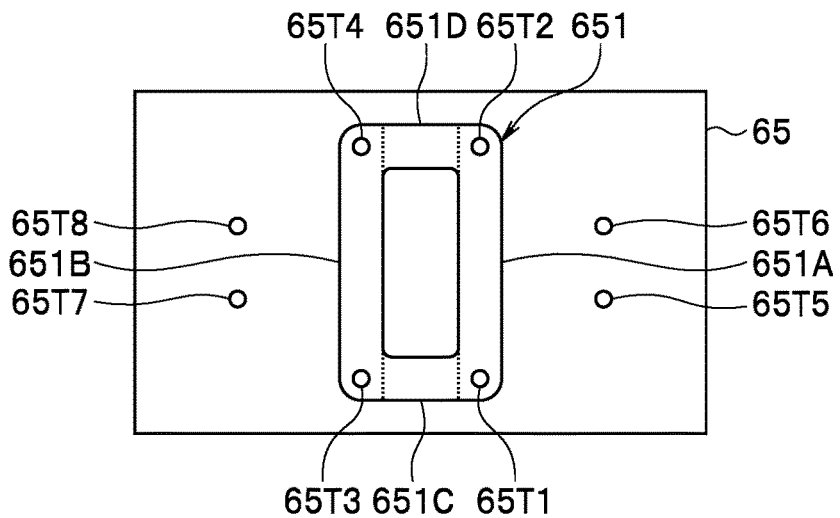
FIG. 6B is an explanatory diagram showing a patterned surface of a fifteenth dielectric layer of the stack of the multilayered filter device according to the first embodiment of the present invention.

FIG. 6B shows a patterned surface of the fifteenth dielectric layer 65. An inductor conductor layer 651 is formed on the patterned surface of the dielectric layer 65. The conductor layer 651 has a ring-like shape. The conductor layer 651 includes a first conductor layer portion 651A, a second conductor layer portion 651B, a first connection portion 651C, and a second connection portion 651D. Each of the first and second conductor layer portions 651A and 651B has a first end and a second end opposite to each other. The first connection portion 651C connects a portion of the first conductor layer portion 651A near the first end thereof and a portion of the second conductor layer portion 651B near the first end thereof. The second connection portion 651D connects a portion of the first conductor layer portion 651A near the second end thereof and a portion of the second conductor layer portion 651B near the second end thereof. In FIG. 6B, boundaries between the first and second conductor layer portions 651A and 651B and the first connection portion 651C and boundaries between the first and second conductor layer portions 651A and 651B and the second connection portion 651D are indicated with dotted lines.

The length (dimension in the long-side direction) of each of the first and second connection portions 651C and 651D is smaller than the length (dimension in the long-side direction) of each of the first and second conductor layer portions 651A and 651B.

Through holes 65T1, 65T2, 65T3, 65T4, 65T5, 65T6, 65T7, and 65T8 are formed in the dielectric layer 65. The through hole 60T1 formed in the dielectric layer 64 and the through hole 65T1 are connected to a portion of the first conductor layer portion 651A near the first end thereof. The through hole 60T2 formed in the dielectric layer 64 and the through hole 65T2 are connected to a portion of the first conductor layer portion 651A near the second end thereof. The through hole 60T3 formed in the dielectric layer 64 and the through hole 65T3 are connected to a portion of the second conductor layer portion 651B near the first end thereof. The through hole 60T4 formed in the dielectric layer 64 and the through hole 65T4 are connected to a portion of the second conductor layer portion 651B near the second end thereof. The through holes 60T5 to 60T8 formed in the dielectric layer 64 are connected to the through holes 65T5 to 65T8, respectively.

Figure 6C:
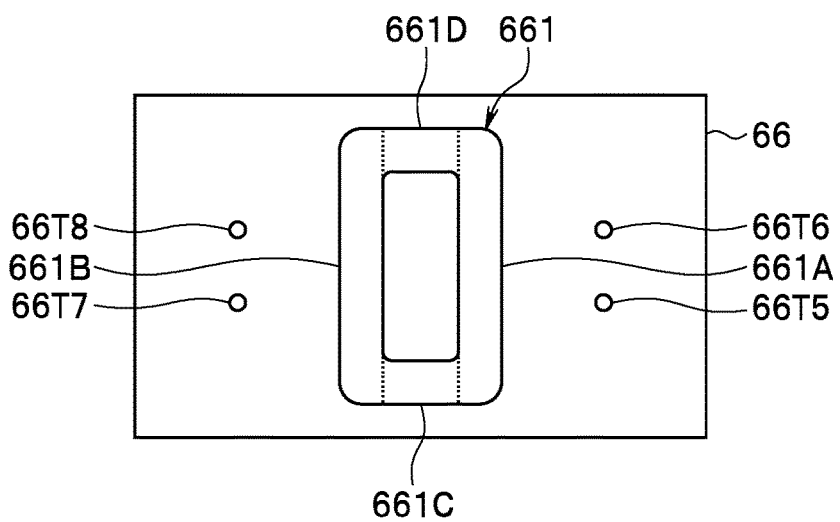
FIG. 6C is an explanatory diagram showing a patterned surface of a sixteenth dielectric layer of the stack of the multilayered filter device according to the first embodiment of the present invention.

FIG. 6C shows a patterned surface of the sixteenth dielectric layer 66. An inductor conductor layer 661 is formed on the patterned surface of the dielectric layer 66. The conductor layer 661 has a ring-like shape. The conductor layer 661 includes a first conductor layer portion 661A, a second conductor layer portion 661B, a first connection portion 661C, and a second connection portion 661D. Each of the first and second conductor layer portions 661A and 661B has a first end and a second end opposite to each other. The first connection portion 661C connects a portion of the first conductor layer portion 661A near the first end thereof and a portion of the second conductor layer portion 661B near the first end thereof. The second connection portion 661D connects a portion of the first conductor layer portion 661A near the second end thereof and a portion of the second conductor layer portion 661B near the second end thereof. In FIG. 6C, boundaries between the first and second conductor layer portions 661A and 661B and the first connection portion 661C and boundaries between the first and second conductor layer portions 661A and 661B and the second connection portion 661D are indicated with dotted lines.

The length (dimension in the long-side direction) of each of the first and second connection portions 661C and 661D is smaller than the length (dimension in the long-side direction) of each of the first and second conductor layer portions 661A and 661B.

The through hole 65T1 formed in the dielectric layer 65 is connected to a portion of the first conductor layer portion 661A near the first end thereof. The through hole 65T2 formed in the dielectric layer 65 is connected to a portion of the first conductor layer portion 661A near the second end thereof. The through hole 65T3 formed in the dielectric layer 65 is connected to a portion of the second conductor layer portion 661B near the first end thereof. The through hole 65T4 formed in the dielectric layer 65 is connected to a portion of the second conductor layer portion 661B near the second end thereof.

Through holes 66T5, 66T6, 66T7, and 66T8 are formed in the dielectric layer 66. The through holes 65T5 to 65T8 formed in the dielectric layer 65 are connected to the through holes 66T5 to 66T8, respectively.

Figure 7A:
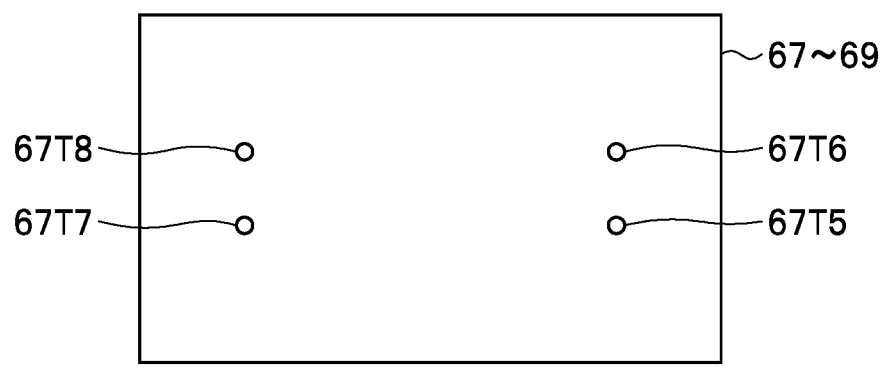
FIG. 7A is an explanatory diagram showing a patterned surface of seventeenth to nineteenth dielectric layers of the stack of the multilayered filter device according to the first embodiment of the present invention.

FIG. 7A shows a patterned surface of each of the seventeenth to nineteenth dielectric layers 67 to 69. Through holes 67T5, 67T6, 67T7, and 67T8 are formed in each of the dielectric layers 67 to 69. The through holes 66T5 to 66T8 formed in the dielectric layer 66 are connected to the through holes 67T5 to 67T8 formed in the dielectric layer 67, respectively. In the dielectric layers 67 to 69, vertically adjacent through holes denoted by the same reference numerals are connected to each other.

Figure 7B:
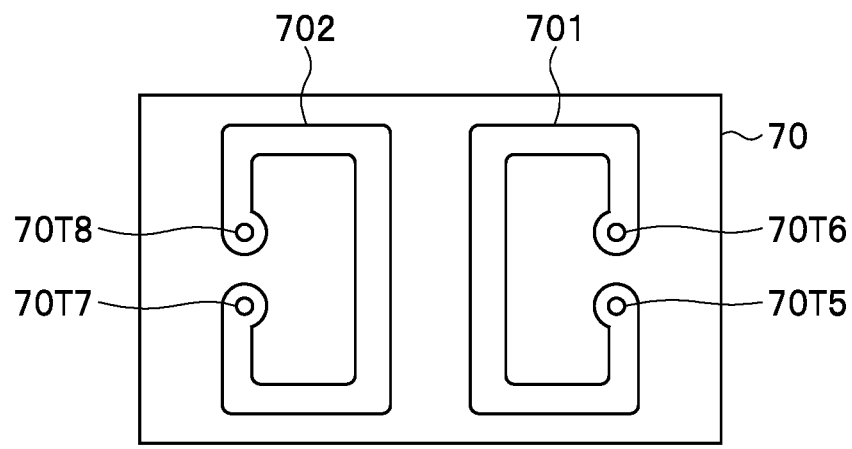
FIG. 7B is an explanatory diagram showing a patterned surface of a twentieth dielectric layer of the stack of the multilayered filter device according to the first embodiment of the present invention.

FIG. 7B shows a patterned surface of the twentieth dielectric layer 70. Inductor conductor layers 701 and 702 are formed on the patterned surface on the dielectric layer 70. Each of the conductor layers 701 and 702 has a first end and a second end opposite to each other. Through holes 70T5, 70T6, 70T7, and 70T8 are formed in the dielectric layer 70. The through hole 67T5 formed in the dielectric layer 69 and the through hole 70T5 are connected to a portion of the conductor layer 701 near the first end thereof. The through hole 67T6 formed in the dielectric layer 69 and the through hole 70T6 are connected to a portion of the conductor layer 701 near the second end thereof. The through hole 67T7 formed in the dielectric layer 69 and the through hole 70T7 are connected to a portion of the conductor layer 702 near the first end thereof. The through hole 67T8 formed in the dielectric layer 69 and the through hole 70T8 are connected to a portion of the conductor layer 702 near the second end thereof.

Figure 7C:
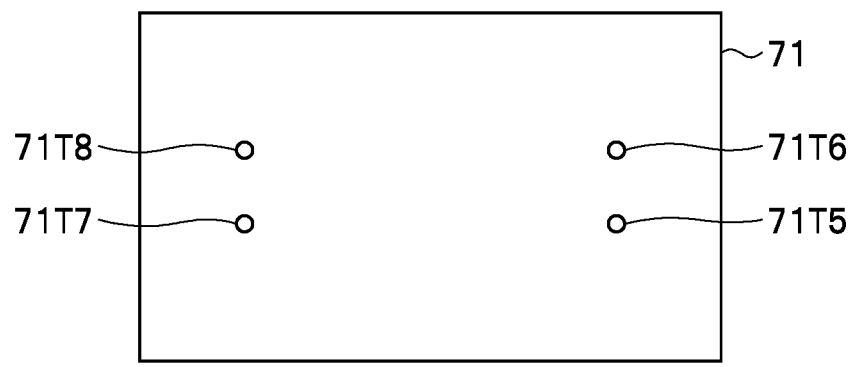
FIG. 7C is an explanatory diagram showing a patterned surface of a twenty-first dielectric layer of the stack of the multilayered filter device according to the first embodiment of the present invention.

FIG. 7C shows a patterned surface of the twenty-first dielectric layer 71. Through holes 71T5, 71T6, 71T7, and 71T8 are formed in the dielectric layer 71. The through holes 70T5 to 70T8 formed in the dielectric layer 70 are connected to the through holes 71T5 to 71T8, respectively.

Figure 8A:
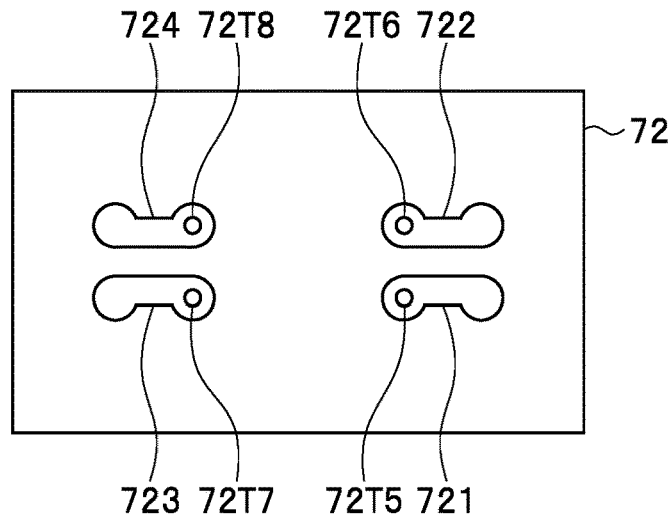
FIG. 8A to FIG. 8C are explanatory diagrams showing respective patterned surfaces of twenty-second to twenty-fourth dielectric layers of the stack of the multilayered filter device according to the first embodiment of the present invention.

FIG. 8A shows a patterned surface of the twenty-second dielectric layer 72. Inductor conductor layers 721, 722, 723, and 724 are formed on the patterned surface of the dielectric layer 72. Each of the conductor layers 721 to 724 has a first end and a second end opposite to each other. The through hole 71T5 formed in the dielectric layer 71 is connected to a portion of the conductor layer 721 near the first end thereof. The through hole 71T6 formed in the dielectric layer 71 is connected to a portion of the conductor layer 722 near the first end thereof. The through hole 71T7 formed in the dielectric layer 71 is connected to a portion of the conductor layer 723 near the first end thereof. The through hole 71T8 formed in the dielectric layer 71 is connected to a portion of the conductor layer 724 near the first end thereof.

Through holes 72T5, 72T6, 72T7, and 72T8 are formed in the dielectric layer 72. The through hole 72T5 is connected to a portion of the conductor layer 721 near the second end thereof. The through hole 72T6 is connected to a portion of the conductor layer 722 near the second end thereof. The through hole 72T7 is connected to a portion of the conductor layer 723 near the second end thereof. The through hole 72T8 is connected to a portion of the conductor layer 724 near the second end thereof.

Figure 8B:
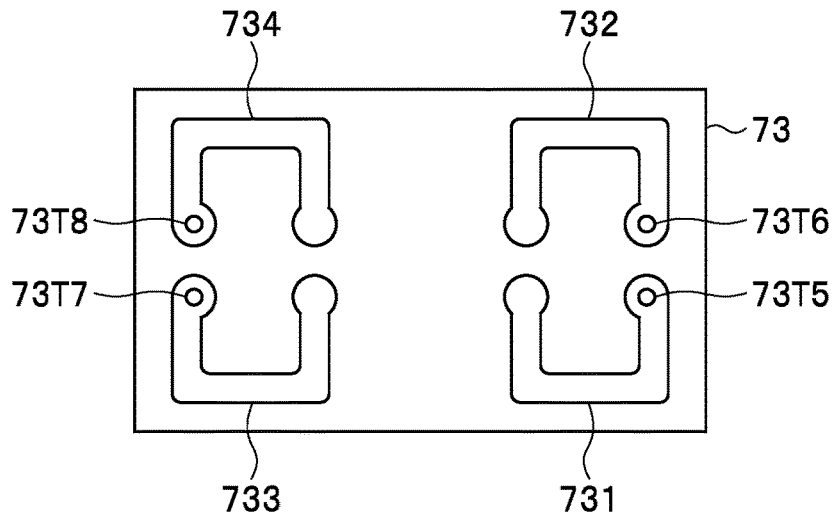

FIG. 8B shows a patterned surface of the twenty-third dielectric layer 73. Inductor conductor layers 731, 732, 733, and 734 are formed on the patterned surface of the dielectric layer 73. Each of the conductor layers 731 to 734 has a first end and a second end opposite to each other. The through hole 72T5 formed in the dielectric layer 72 is connected to a portion of the conductor layer 731 near the first end thereof. The through hole 72T6 formed in the dielectric layer 72 is connected to a portion of the conductor layer 732 near the first end thereof. The through hole 72T7 formed in the dielectric layer 72 is connected to a portion of the conductor layer 733 near the first end thereof. The through hole 72T8 formed in the dielectric layer 72 is connected to a portion of the conductor layer 734 near the first end thereof.

Through holes 73T5, 73T6, 73T7, and 73T8 are formed in the dielectric layer 73. The through hole 73T5 is connected to a portion of the conductor layer 731 near the second end thereof. The through hole 73T6 is connected to a portion of the conductor layer 732 near the second end thereof. The through hole 73T7 is connected to a portion of the conductor layer 733 near the second end thereof. The through hole 73T8 is connected to a portion of the conductor layer 734 near the second end thereof.

Figure 8C:
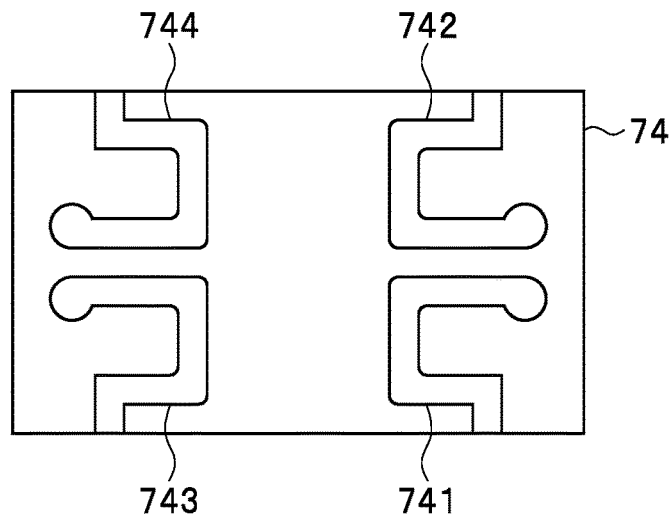

FIG. 8C shows a patterned surface of the twenty-fourth dielectric layer 74. Inductor conductor layers 741, 742, 743, and 744 are formed on the patterned surface of the dielectric layer 74. Each of the conductor layers 741 to 744 has a first end and a second end opposite to each other. The through hole 73T5 formed in the dielectric layer 73 is connected to a portion of the conductor layer 741 near the first end thereof. The through hole 73T6 formed in the dielectric layer 73 is connected to a portion of the conductor layer 742 near the first end thereof. The through hole 73T7 formed in the dielectric layer 73 is connected to a portion of the conductor layer 743 near the first end thereof. The through hole 73T8 formed in the dielectric layer 73 is connected to a portion of the conductor layer 744 near the first end thereof.

The second end of the conductor layer 741 is connected to the balanced input terminal 111 (see FIG. 2). The second end of the conductor layer 742 is connected to the balanced input terminal 116 (see FIG. 2). The second end of the conductor layer 743 is connected to the balanced output terminal 113 (see FIG. 2). The second end of the conductor layer 744 is connected to the balanced output terminal 114 (see FIG. 2).

Figure 9A:
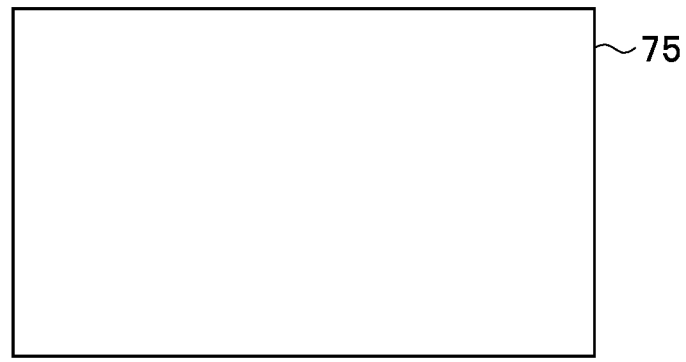
FIG. 9A and FIG. 9B are explanatory diagrams showing respective patterned surfaces of twenty-fifth and twenty-sixth dielectric layers of the stack of the multilayered filter device according to the first embodiment of the present invention.

FIG. 9A shows a patterned surface of the twenty-fifth dielectric layer 75. Neither conductor layers nor through holes are formed in the dielectric layer 75.

Figure 9B:
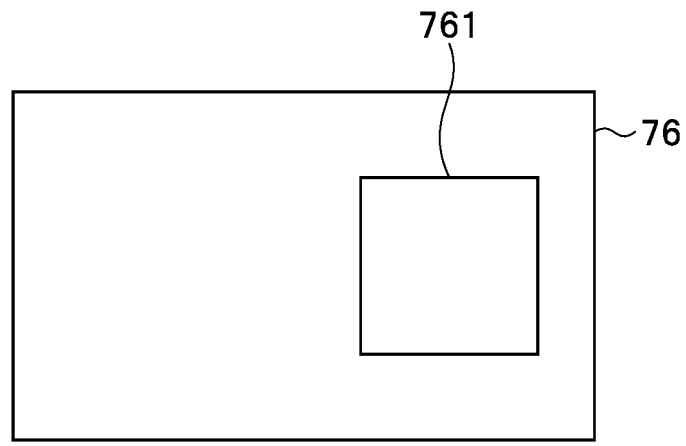

FIG. 9B shows a patterned surface of the twenty-sixth dielectric layer 76. A mark 761 formed of a conductor layer is formed on the patterned surface of the dielectric layer 76.

The stack 50 shown in FIG. 2 is formed by stacking the first to twenty-sixth dielectric layers 51 to 76 such that the patterned surface of the first dielectric layer 51 serves as the bottom surface 50A of the stack 50 and the surface of the twenty-sixth dielectric layer 76 opposite to the patterned surface thereof serves as the top surface 50B of the stack 50.

Figure 10:
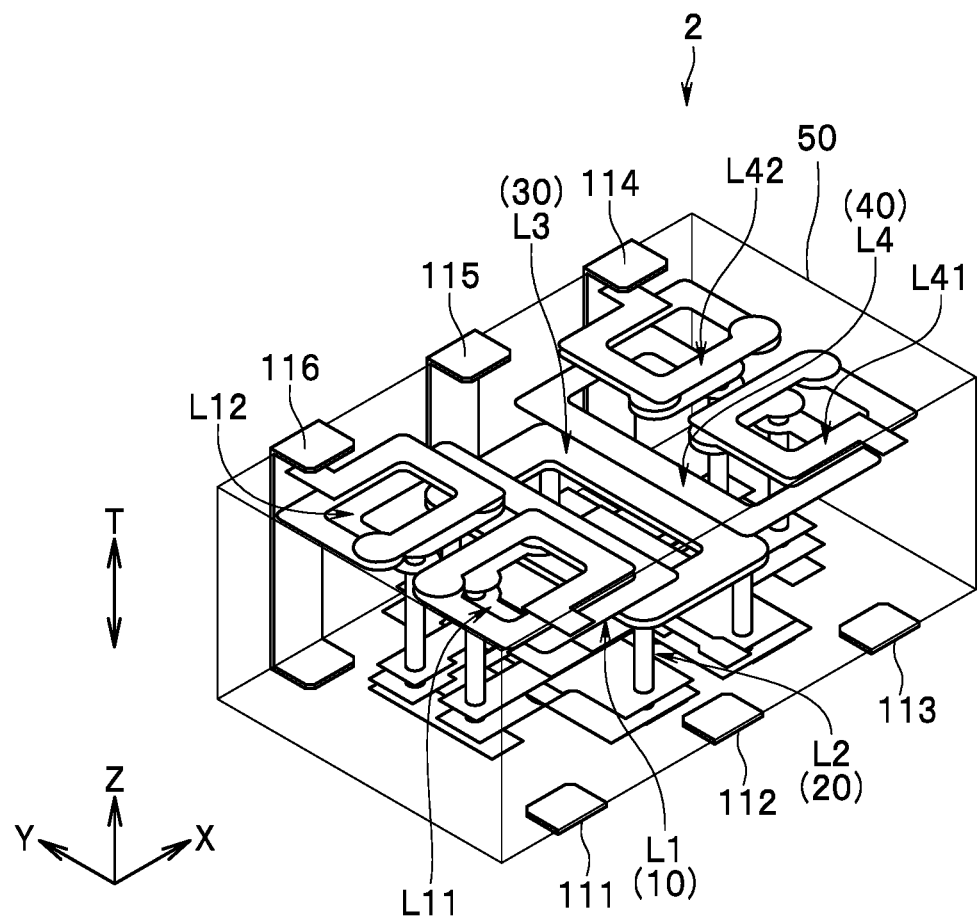
FIG. 10 is a perspective view showing an internal structure of the stack of the multilayered filter device according to the first embodiment of the present invention.

FIG. 10 shows an internal structure of the stack 50 formed by stacking the first to twenty-sixth dielectric layers 51 to 76. As shown in FIG. 10, in the internal structure of the stack 50, the plurality of conductor layers and the plurality of through holes shown in FIG. 3A to FIG. 8C are stacked. Note that the mark 761 is omitted in FIG. 10.

Correspondences between the components of the filter circuit 1 shown in FIG. 1 and the internal components of the stack 50 shown in FIG. 3A to FIG. 8C will be described below. The inductor L1 of the resonator 10 is formed of the inductor conductor layer 701 shown in FIG. 7B.

The inductor L2 of the resonator 20 is formed of the first conductor layer portion 651A of the inductor conductor layer 651 shown in FIG. 6B, the first conductor layer portion 661A of the inductor conductor layer 661 shown in FIG. 6C, and through holes nT1 and nT2 shown in FIG. 4C to FIG. 6B. Note that, regarding the reference numerals to denote the through holes, n is an integer from 54 to 60, or 65.

The inductor L3 of the resonator 30 is formed of the second conductor layer portion 651B of the inductor conductor layer 651 shown in FIG. 6B, the second conductor layer portion 661B of the inductor conductor layer 661 shown in FIG. 6C, and through holes nT3 and nT4 shown in FIG. 4C to FIG. 6B.

The inductor L4 of the resonator 40 is formed of the inductor conductor layer 702 shown in FIG. 7B.

The input inductor L11 is formed of the inductor conductor layers 721, 731, and 741 and the through holes 72T5 and 73T5 shown in FIG. 8A to FIG. 8C. The input inductor L12 is formed of the inductor conductor layers 722, 732, and 742 and the through holes 72T6 and 73T6 shown in FIG. 8A to FIG. 8C.

The output inductor L41 is formed of the inductor conductor layers 723, 733, and 743 and the through holes 72T7 and 73T7 shown in FIG. 8A to FIG. 8C. The output inductor L42 is formed of the inductor conductor layers 724, 734, and 744 and the through holes 72T8 and 73T8 shown in FIG. 8A to FIG. 8C.

The capacitor C1 is formed of the conductor layers 541, 551, 561, and 571 and the dielectric layers 54 to 56 between these conductor layers shown in FIG. 4A to FIG. 5A. The capacitor C2 is formed of the conductor layers 542, 552, 562, and 572 and the dielectric layers 54 to 56 between these conductor layers shown in FIG. 4A to FIG. 5A. The capacitor C3 is formed of the conductor layers 543, 553, 563, and 573 and the dielectric layers 54 to 56 between these conductor layers shown in FIG. 4A to FIG. 5A. The capacitor C4 is formed of the conductor layers 544, 554, 564, and 574 and the dielectric layers 54 to 56 between these conductor layers shown in FIG. 4A to FIG. 5A.

The capacitors C5, C11, and C41 are formed of the conductor layers 535, 551, 553, 571, 573, 581, and 591 and the dielectric layers 53, 54, 57, and 58 between these conductor layers shown in FIG. 3C, FIG. 4B, and FIG. 5A to FIG. 5C.

The capacitors C6, C12, and C42 are formed of the conductor layers 536, 552, 554, 572, 574, 582, and 591 and the dielectric layers 53, 54, 57, and 58 between these conductor layers shown in FIG. 3C, FIG. 4B, and FIG. 5A to FIG. 5C.

The capacitor C20 is formed of the conductor layers 531, 532, 541, and 542 and the dielectric layer 53 between these conductor layers shown in FIG. 3C and FIG. 4A. The capacitor C30 is formed of the conductor layers 533, 534, 543, and 544 and the dielectric layer 53 between these conductor layers shown in FIG. 3C and FIG. 4A.

Figure 11:
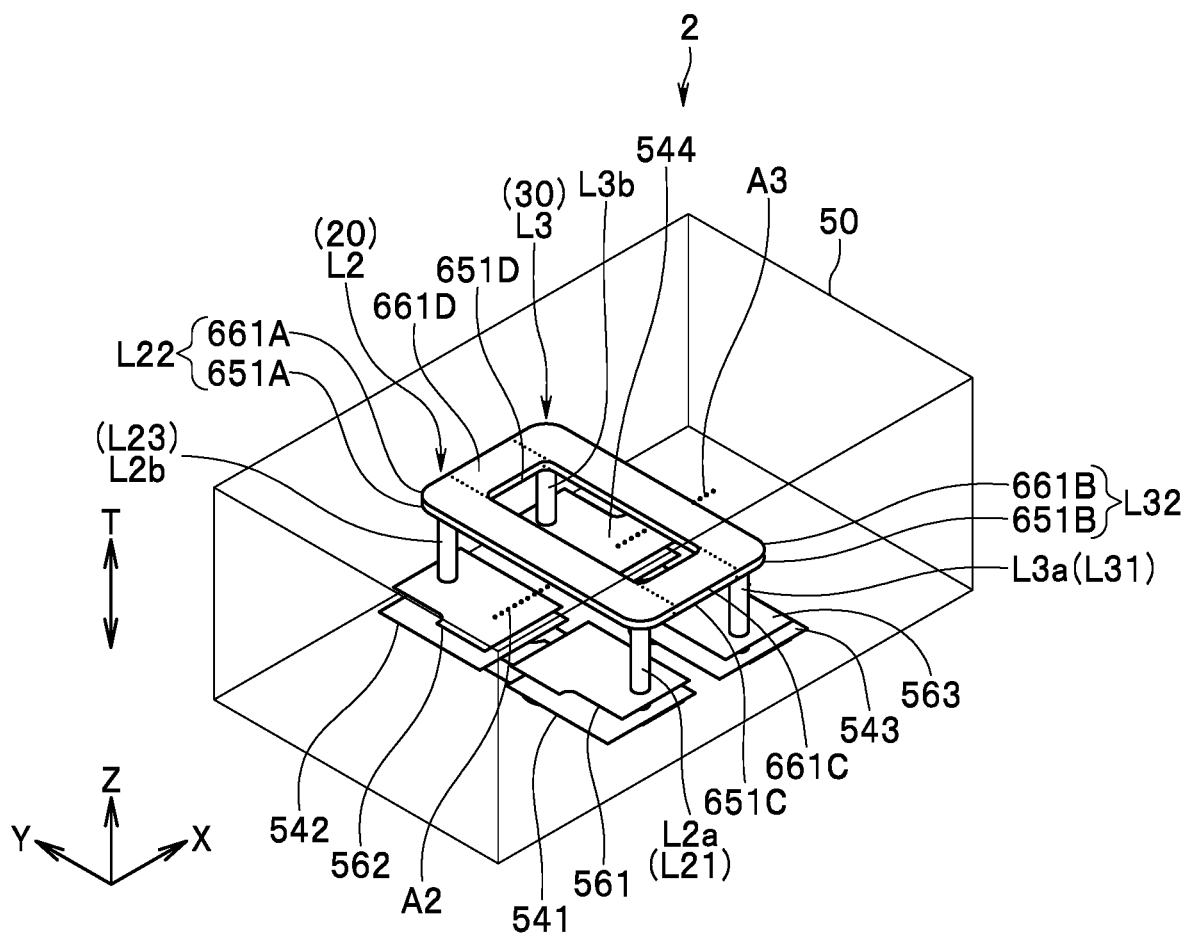
FIG. 11 is a perspective view showing first and second resonators of the multilayered filter device according to the first embodiment of the present invention.
Figure 12:
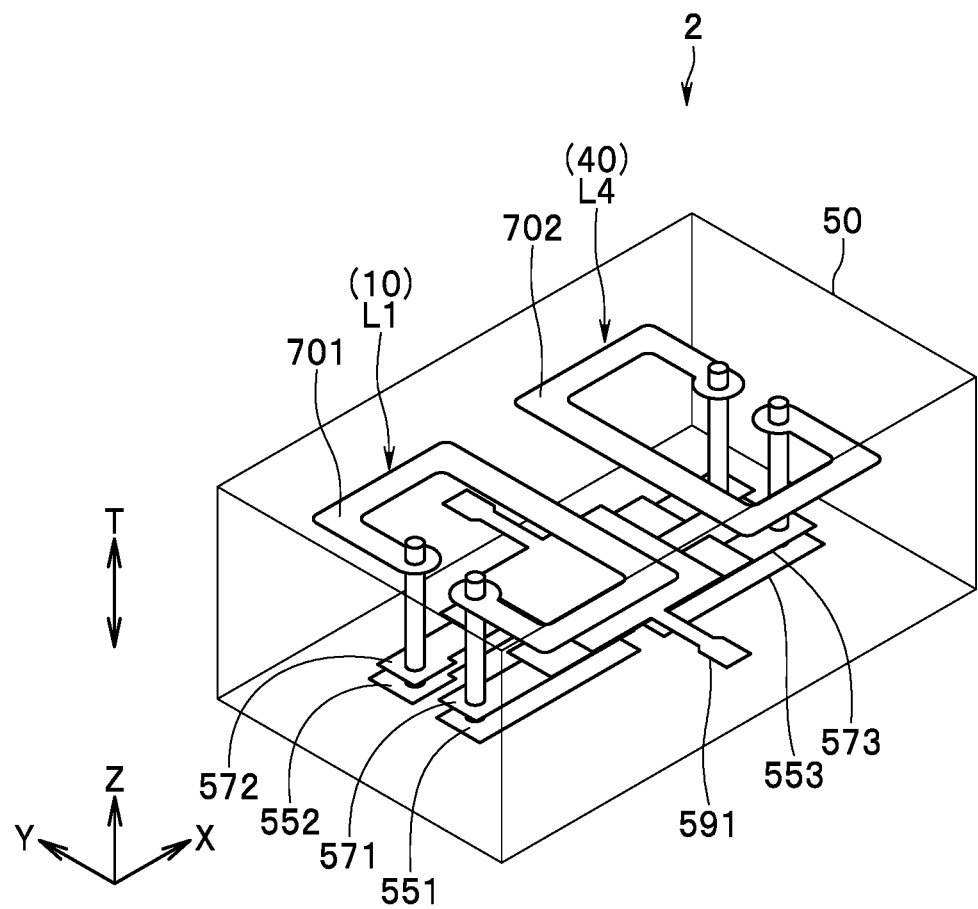
FIG. 12 is a perspective view showing third and fourth inductors of the multilayered filter device according to the first embodiment of the present invention.
Figure 13:
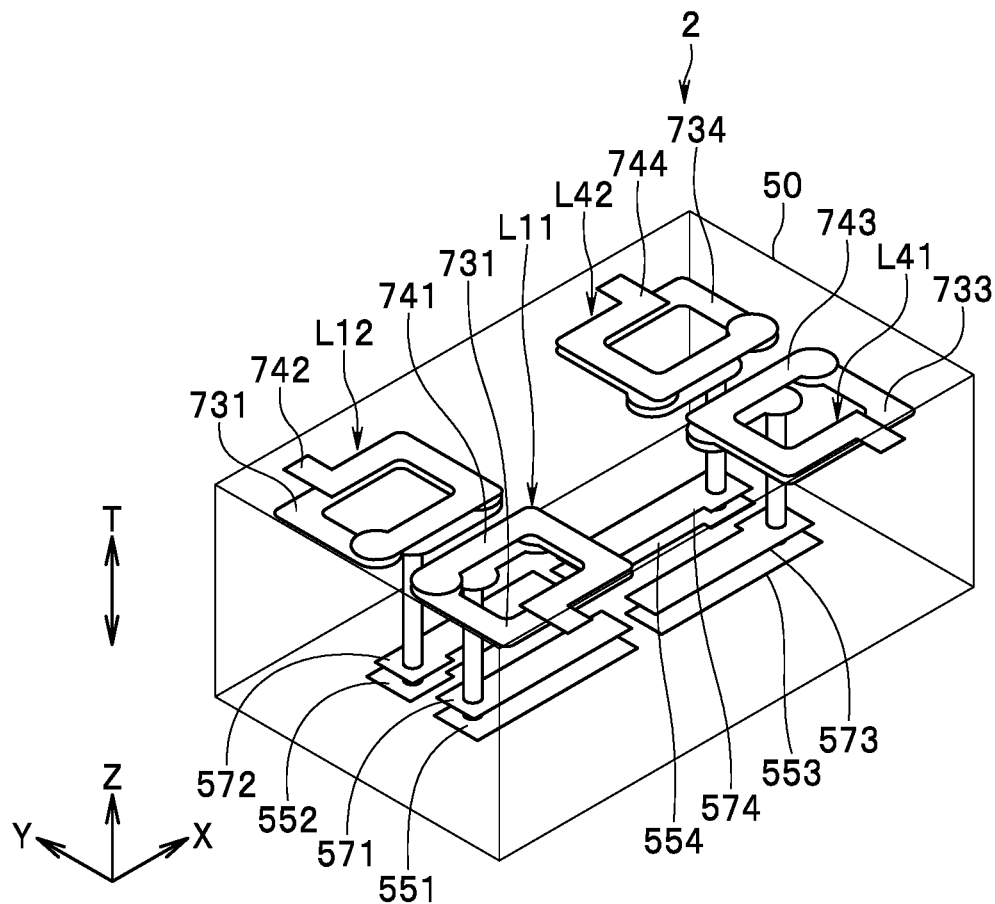
FIG. 13 is a perspective view showing input inductors and output inductors of the multilayered filter device according to the first embodiment of the present invention.

Next, with reference to FIG. 2 and FIG. 10 to FIG. 13, structural features of the filter device 2 according to the present embodiment will be described. FIG. 11 is a perspective view showing the resonators 20 and 30. FIG. 12 is a perspective view showing the inductors L1 and L4. FIG. 13 is a perspective view showing the input inductors L11 and L12 and the output inductors L41 and L42.

First, the resonators 20 and 30 will be described. As shown in FIG. 10 and FIG. 11, the inductor L2 of the resonator 20 and the inductor L3 of the resonator 30 are arrayed in a long-side direction of the bottom surface 50A or the top surface 50B, in other words, a direction parallel to the X direction. The inductor L2 is arranged at a position closer to the side surface 50C than to the side surface 50D. The inductor L3 is arranged at a position closer to the side surface 50D than to the side surface 50C.

The inductor L2 is wound around an axis A2. The inductor L3 is wound around an axis A3. Each of the axes A2 and A3 extends in a direction orthogonal to the stacking direction T. In the present embodiment in particular, each of the axes A2 and A3 extends in a direction parallel to the X direction. In FIG. 11, for the sake of convenience, the axis A2 and the axis A3 are depicted with straight lines different from each other. However, the axes A2 and A3 may be one axis.

As shown in FIG. 10 and FIG. 11, an opening of the inductor L2 and an opening of the inductor L3 face each other. In other words, the opening of the inductor L2 and the opening of the inductor L3 overlap each other when seen in the X direction. Accordingly, in the present embodiment, magnetic coupling between the inductors L2 and L3 is stronger than when the opening of the inductor L2 and the opening of the inductor L3 do not overlap each other.

The inductor L2 corresponds to a "first inductor" in the present invention. The inductor L3 corresponds to a "second inductor" in the present invention.

Here, a structure formed with two or more through holes being connected in series is referred to as a through hole line. The inductor L2 includes a first through hole line L2a, a second through hole line L2b, and the first conductor layer portions 651A and 661A connecting the first through hole line L2a and the second through hole line L2b. The first through hole line L2a is formed with the plurality of through holes nT1 being connected in series. The second through hole line L2b is formed with the plurality of through holes nT2 being connected in series. Note that, as described above, n is an integer from 54 to 60, or 65.

Each of the first conductor layer portions 651A and 661A extends in a short-side direction of the bottom surface 50A or the top surface 50B, in other words, a direction parallel to the Y direction. The first through hole line L2a and the second through hole line L2b are arrayed in a direction parallel to the Y direction. The opening of the inductor L2 is a region surrounded by the first through hole line L2a, the second through hole line L2b, and the first conductor layer portion 651A.

The first part L21 of the inductor L2 is formed of the first through hole line L2a. The second part L22 of the inductor L2 is formed of the first conductor layer portions 651A and 661A. The third part L23 of the inductor L2 is formed of the second through hole line L2b.

None of the first and second through hole lines L2a and L2b (through holes nT1 and nT2) and the first conductor layer portions 651A and 661A is electrically connected to the terminals 112 and 115. Thus, the inductor L2, in other words, the resonator 20, is not electrically connected to the ground.

The inductor L3 includes a first through hole line L3a, a second through hole line L3b, and the second conductor layer portions 651B and 661B connecting the first through hole line L3a and the second through hole line L3b. The first through hole line L3a is formed with the plurality of through holes nT3 being connected in series. The second through hole line L3b is formed with the plurality of through holes nT4 being connected in series.

Each of the second conductor layer portions 651B and 661B extends in a short-side direction of the bottom surface 50A and the top surface 50B, in other words, a direction parallel to the Y direction. The first through hole line L3a and the second through hole line L3b are arrayed in a direction parallel to the Y direction. The opening of the inductor L3 is a region surrounded by the first through hole line L3a, the second through hole line L3b, and the second conductor layer portion 651B.

The first part L31 of the inductor L3 is formed of the first through hole line L3a. The second part L32 of the inductor L3 is formed of the second conductor layer portions 651B and 661B. The third part L33 of the inductor L3 is formed of the second through hole line L3b.

None of the first and second through hole lines L3a and L3b (through holes nT3 and nT4) and the second conductor layer portions 651B and 661B is electrically connected to the terminals 112 and 115 being connected to the ground. Thus, the inductor L3, in other words, the resonator 30, is not electrically connected to the ground.

The resonators 20 and 30 are electrically connected to each other in the stack 50. In other words, the inductors L2 and L3 are connected by the first connection portions 651C and 661C and the second connection portions 651D and 661D. In the present embodiment in particular, the first conductor layer portion 651A of the inductor L2, the second conductor layer portion 651B of the inductor L3, the first connection portion 651C, and the second connection portion 651D are formed of one inductor conductor layer 651. The first conductor layer portion 661A of the inductor L2, the second conductor layer portion 661B of the inductor L3, the first connection portion 661C, and the second connection portion 661D are formed of one inductor conductor layer 661.

Next, the capacitors C20 and C30 will be described. None of the conductor layers 531, 532, 541, and 542 constituting the capacitor C20 is electrically connected to the terminals 112 and 115 being connected to the ground. Thus, the capacitor C20 is not electrically connected to the ground. None of the conductor layers 533, 534, 543, and 544 constituting the capacitor C30 is electrically connected to the terminals 112 and 115 being connected to the ground. Thus, the capacitor C30 is not electrically connected to the ground.

Next, the inductors L1 and L4 will be described. Each of the inductors L1 and L4 are arranged at a position between the inductors L2 and L3 and the top surface 50B (see FIG. 2 and FIG. 10). The inductor L1 is arranged at a position closer to the side surface 50C than to the side surface 50D. The inductor L4 is arranged at a position closer to the side surface 50D than to the side surface 50C.

As shown in FIG. 10 and FIG. 12, the inductor conductor layer 701 constituting the inductor L1 and the inductor conductor layer 702 constituting the inductor L4 are arranged at positions different from the resonators 20 and 30 (inductors L2 and L3) in the stacking direction T. As shown in FIG. 12, the conductor layers 701 and 702 are each wound around an axis extending in a direction parallel to the stacking direction T.

The inductor L1 corresponds to a "third inductor" in the present invention. The inductor L4 corresponds to a "fourth inductor" in the present invention.

The opening of the inductor L1 is a region surrounded by the conductor layer 701. The opening of the inductor L1 does not overlap the opening of the inductor L2 when seen in the Z direction. Accordingly, in the present embodiment, magnetic coupling between the inductors L1 and L2 is weaker than when the opening of the inductor L1 faces the opening of the inductor L2.

The opening of the inductor L4 is a region surrounded by the conductor layer 702. The opening of the inductor L4 does not overlap the opening of the inductor L3 when seen in the Z direction. Accordingly, in the present embodiment, magnetic coupling between the inductors L3 and L4 is weaker than when the opening of the inductor L4 faces the opening of the inductor L3.

Next, the input inductors L11 and L12 will be described. Each of the input inductors L11 and L12 is arranged at a position between the inductor L1 and the top surface 50B (see FIG. 2 and FIG. 10). The input inductor L11 is arranged at a position closer to the side surface 50E than to the side surface 50F. The input inductor L12 is arranged at a position closer to the side surface 50F than to the side surface 50E. As shown in FIG. 13, the input inductors L11 and L12 are each wound around an axis extending in a direction parallel to the stacking direction T.

Next, the output inductors L41 and L42 will be described. Each of the output inductors L41 and L42 is arranged at a position between the inductor L4 and the top surface 50B (see FIG. 2 and FIG. 10). The output inductor L41 is arranged at a position closer to the side surface 50E than to the side surface 50F. The output inductor L42 is arranged at a position closer to the side surface 50F than to the side surface 50E. As shown in FIG. 13, the output inductors L41 and L42 are each wound around an axis extending in a direction parallel to the stacking direction T.

Figure 14:
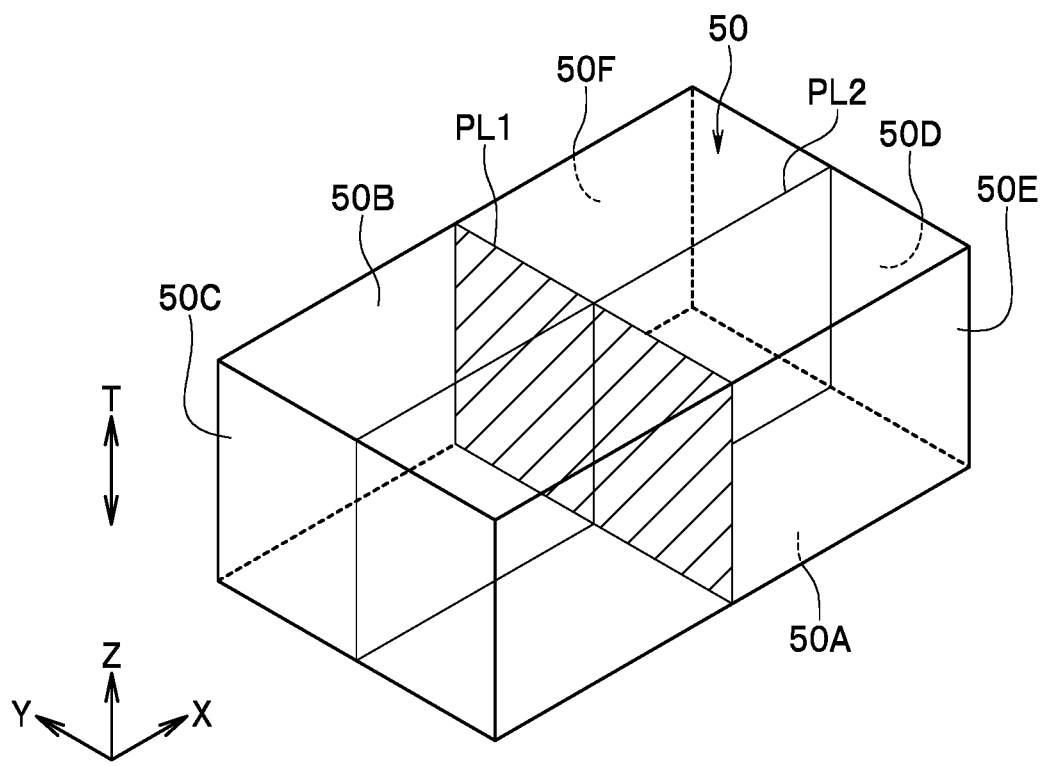
FIG. 14 is an explanatory diagram for describing first and second imaginary planes according to the first embodiment of the present invention.

Here, a first imaginary plane PL1 passing between the inductor L2 and the inductor L3 and being in parallel to the stacking direction T of the plurality of dielectric layers and a second imaginary plane PL2 crossing the inductors L2 and L3 and being in parallel to the stacking direction T of the plurality of dielectric layers are assumed. FIG. 14 is an explanatory diagram for describing the first and second imaginary planes PL1 and PL2. Note that, in FIG. 14, for the sake of better understanding, the first imaginary plane PL1 is hatched.

In the present embodiment in particular, the first imaginary plane PL1 is a YZ plane perpendicular to each of the bottom surface 50A and the top surface 50B. The first imaginary plane PL1 crosses the stack 50 at the center of the stack 50 in the long-side direction (direction parallel to the X direction) of the bottom surface 50A or the top surface 50B.

In the present embodiment in particular, the second imaginary plane PL2 is an XZ plane perpendicular to each of the bottom surface 50A and the top surface 50B. The second imaginary plane PL2 crosses the stack 50 at the center of the stack 50 in the short-side direction (direction parallel to the Y direction) of the bottom surface 50A or the top surface 50B.

In the stack 50 except the dielectric layers 75 and 76, a plurality of conductors (a plurality of conductor layers and a plurality of through holes) constituting a part including the pair of balanced input terminals 111 and 116, the resonator 10 (inductor L1), the resonator 20 (inductor L2), the input inductors L11 and L12, and the capacitors C1, C2, and C20 are referred to as a plurality of first conductors. In the stack 50 except the dielectric layers 75 and 76, a plurality of conductors (a plurality of conductor layers and a plurality of through holes) constituting a part including the pair of balanced output terminals 113 and 114, the resonator 30 (inductor L3), the resonator 40 (inductor L4), the output inductors L41 and L42, and the capacitors C3, C4, and C30 are referred to as a plurality of second conductors. The shape and the arrangement of the plurality of first conductors are symmetrical with the shape and the arrangement of the plurality of second conductors, with respect to the first imaginary plane PL1.

In the present embodiment in particular, the shapes and the arrangements of the plurality of conductors in each of a pair of the inductors L1 and L4 and a pair of the inductors L2 and L3 are symmetrical with respect to the first imaginary plane PL1. The shapes and the arrangements of the plurality of conductors in each of a pair of the input inductor L11 and the output inductor L41 and a pair of the input inductor L12 and the output inductor L42 are symmetrical with respect to the first imaginary plane PL1. The shapes and the arrangements of the plurality of conductors in each of a pair of the capacitors C1 and C3, a pair of the capacitors C2 and C4, and a pair of the capacitors C20 and C30 are symmetrical with respect to the first imaginary plane PL1.

In the stack 50 except the dielectric layers 75 and 76, a plurality of conductors (a plurality of conductor layers and a plurality of through holes) constituting a part including the balanced input terminal 111, the balanced output terminal 113, the input inductor L11, the output inductor L41, and the capacitors C1, C3, C5, C11, and C41 are referred to as a plurality of third conductors. In the stack 50 except the dielectric layers 75 and 76, a plurality of conductors (a plurality of conductor layers and a plurality of through holes) constituting a part including the balanced input terminal 116, the balanced output terminal 114, the input inductor L12, the output inductor L42, and the capacitors C2, C4, C6, C12, and C42 are referred to as a plurality of fourth conductors. The shape and the arrangement of the plurality of third conductors are symmetrical with the shape and the arrangement of the plurality of fourth conductors, with respect to the second imaginary plane PL2.

In the present embodiment in particular, the shapes and the arrangements of the plurality of conductors in each of a pair of the input inductors L11 and L12 and a pair of the output inductors L41 and L42 are symmetrical with respect to the second imaginary plane PL2. The shapes and the arrangements of the plurality of conductors in each of a pair of the capacitors C1 and C2 and a pair of the capacitors C3 and C4 are symmetrical with respect to the second imaginary plane PL2. The inductors L1 to L4 have a symmetrical shape with respect to the second imaginary plane PL2.

Next, working and effects of the filter circuit 1 according to the present embodiment and the filter device 2 according to the present embodiment will be described. The filter circuit 1 according to the present embodiment is a balanced band-pass filter. In the present embodiment, the resonators 20 and 30 are magnetically coupled to each other. If capacitors connected to the ground are provided to both ends of each of the resonators 20 and 30, the number of capacitors is four. In contrast, in the present embodiment, the capacitors C20 and C30 not electrically connected to the ground are connected in parallel to the resonators 20 and 30, respectively. In other words, in the present embodiment, the number of capacitors connected to the resonators 20 and 30 is two. In this manner, according to the present embodiment, the number of capacitors connected to the resonators 20 and 30 can be reduced as compared to when capacitors connected to the ground are provided to both ends of each of the resonators 20 and 30. As a result, according to the present embodiment, the filter circuit 1 can be downsized.

In the filter device 2 according to the present embodiment, as described above, the number of capacitors connected to the resonators 20 and 30 can be reduced, and accordingly the number of conductor layers constituting the capacitors can be reduced. With this, according to the present embodiment, the filter device 2 can be downsized.

In the present embodiment, the resonators 20 and 30, in other words, the inductors L2 and L3, are electrically connected to each other. The inductors L2 and L3 are electrically connected to each other in at least one aspect of a first aspect in which one end of the second part L22 of the inductor L2 and one end of the second part L32 of the inductor L3 are electrically connected to each other, or a second aspect in which the other end of the second part L22 of the inductor L2 and the other end of the second part L32 of the inductor L3 are electrically connected to each other. In the present embodiment in particular, the inductors L2 and L3 are electrically connected to each other in both of the first aspect and the second aspect. With this, according to the present embodiment, the magnetic coupling between the inductors L2 and L3 can be strengthened, and as a result, an abrupt attenuation pole can be formed.

In the present embodiment, the opening of the inductor L1 of the resonator 10 close to the pair of balanced input terminals 111 and 116 in the circuit configuration does not face the opening of the inductor L4 of the resonator 40 close to the pair of balanced output terminals 113 and 114 in the circuit configuration. With this, according to the present embodiment, the magnetic coupling between the inductors L1 and L4 can be weakened, and as a result, capacitance of each of the capacitors C1 to C4 can be reduced. With this, according to the present embodiment, the number of the plurality of conductor layers constituting the capacitors C1 to C4 can be reduced, and the plurality of conductor layers can be downsized. With this, according to the present embodiment, the filter device 2 can be downsized.

Next, other effects of the present embodiment will be described. As described above, in the present embodiment, magnetic coupling between the inductors L1 and L4 can be weakened. With this, according to the present embodiment, in a frequency band lower than a passband of the filter circuit 1 (filter device 2), an absolute value of pass attenuation can be increased.

In the present embodiment, the inductor conductor layer 701 constituting the inductor L1 and the inductor conductor layer 702 constituting the inductor L4 are arranged at positions different from the resonators 20 and 30 (inductors L2 and L3) in the stacking direction T. With this, according to the present embodiment, the filter device 2 can be downsized with a space in the stack 50 being efficiently used. According to the present embodiment, the magnetic coupling between the inductors L1 and L2 and the magnetic coupling between the inductors L3 and L4 can each be weakened.

Figure 15:
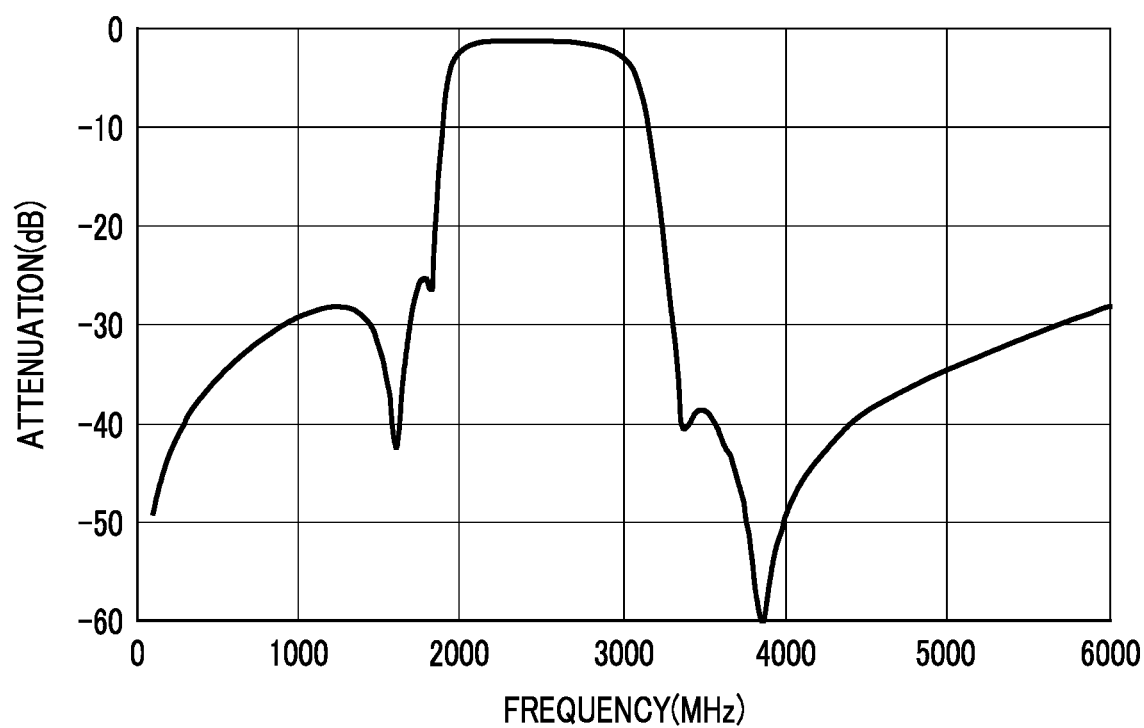
FIG. 15 is a characteristic chart showing an example of pass attenuation characteristics of the multilayered filter device according to the first embodiment of the present invention.

Next, an example of characteristics of the filter device 2 according to the present embodiment will be described. Here, an example of characteristics of the filter device 2 when the passband of the filter device 2 is designed to include a frequency band of 2.2 GHz to 2.7 GHz will be described. FIG. 15 is a characteristic chart showing an example of pass attenuation characteristics of the filter device 2. In FIG. 15, the horizontal axis represents frequency, and the vertical axis represents attenuation.

Figure 16:
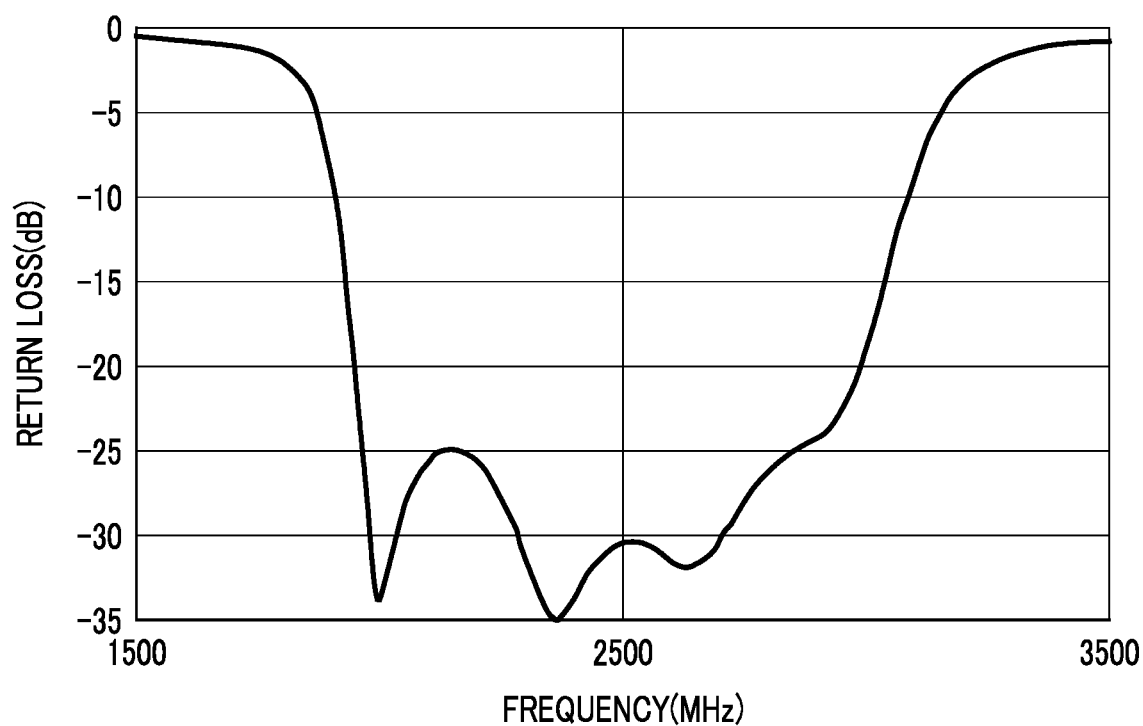
FIG. 16 is a characteristic chart showing an example of return loss of the multilayered filter device according to the first embodiment of the present invention.

FIG. 16 is a characteristic chart showing an example of return loss characteristics in the pair of balanced input terminals 111 and 116 of the filter device 2. In FIG. 16, the horizontal axis represents frequency, and the vertical axis represents return loss.

Figure 17:
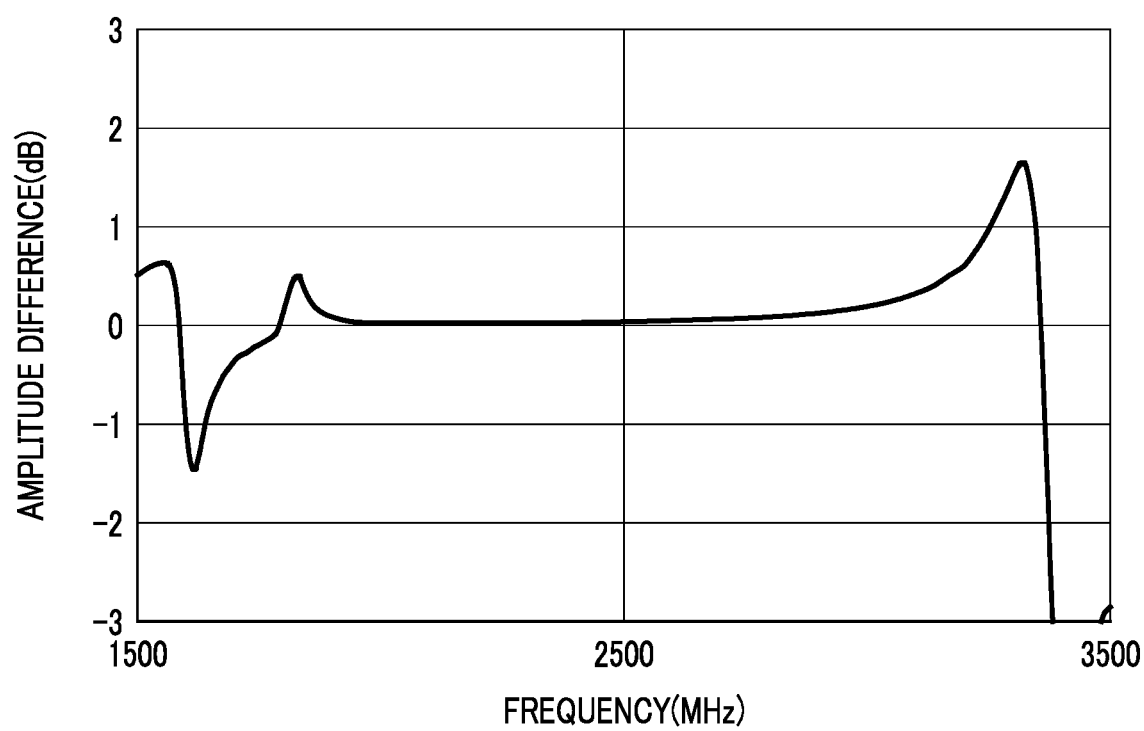
FIG. 17 is a characteristic chart showing an example of amplitude balance characteristics of the multilayered filter device according to the first embodiment of the present invention.

FIG. 17 shows an example of amplitude balance characteristics of the filter device 2. Here, the amplitude balance characteristics of the filter device 2 are shown using a difference of amplitudes of two balanced element signals output from the pair of balanced output terminals 113 and 114 when balanced signals are input to the pair of balanced input terminals 111 and 116. The difference of amplitudes of two balanced element signals is hereinafter referred to as an amplitude difference. The amplitude difference is shown using a positive value on the condition that the amplitude of the balanced element signal output from the balanced output terminal 113 is larger than the amplitude of the balanced element signal output from the balanced output terminal 114, and in a case opposite to the above, the amplitude difference is shown using a negative value.

In FIG. 17, the horizontal axis represents frequency, and the vertical axis represents amplitude difference. With the amplitude difference being represented by m (dB), a value of m is preferably −1.0 or more and not more than 1.0. As shown in FIG. 17, the filter device 2 has an m value of −1.0 or more and not more than 1.0 in the foregoing frequency band.

Figure 18:
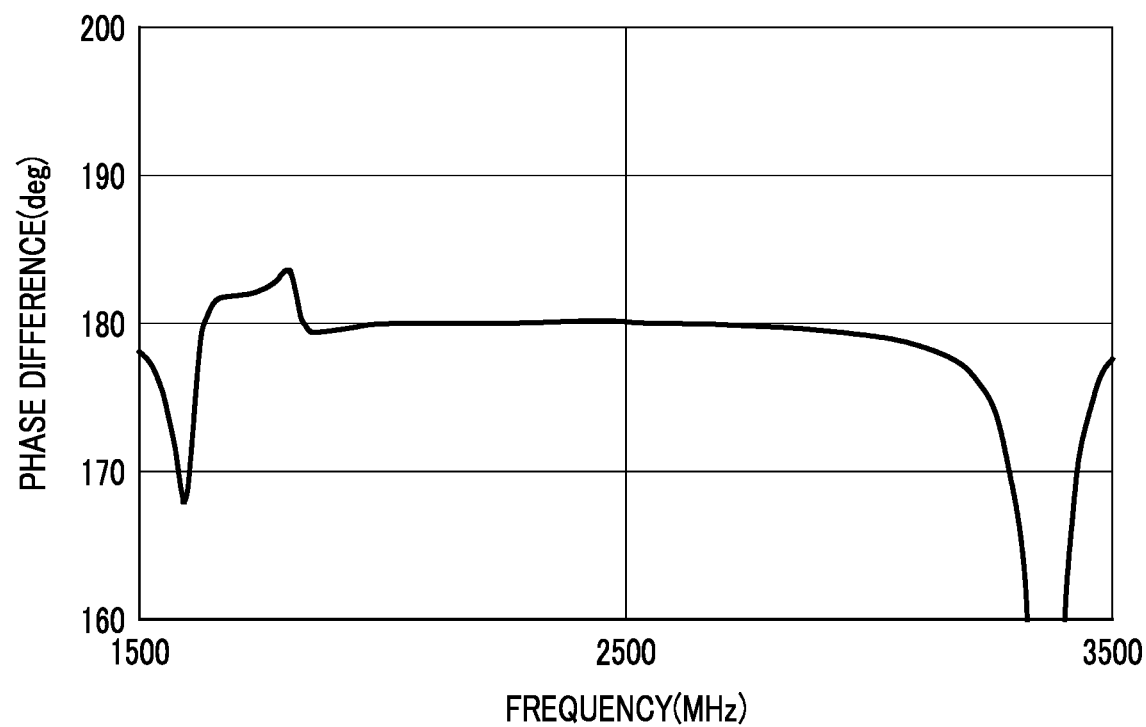
FIG. 18 is a characteristic chart showing an example of phase balance characteristics of the multilayered filter device according to the first embodiment of the present invention.

FIG. 18 shows an example of phase balance characteristics of the filter device 2. Here, the phase balance characteristics of the filter device 2 are shown using a difference of phases of two balanced element signals output from the pair of balanced output terminals 113 and 114 when balanced signals are input to the pair of balanced input terminals 111 and 116. The difference of phases of two balanced element signals is hereinafter referred to as a phase difference. The phase difference represents a degree of advance of the balanced element signal output from the balanced output terminal 113 with respect to the phase of the balanced element signal output from the balanced output terminal 114.

In FIG. 18, the horizontal axis represents frequency, and the vertical axis represents phase difference. With the amplitude difference being represented by p (deg), a value of p is preferably 170 or more and not more than 190. As shown in FIG. 18, the filter device 2 has a p value of 170 or more and not more than 190 in the foregoing frequency band.

Second Embodiment

Figure 19:
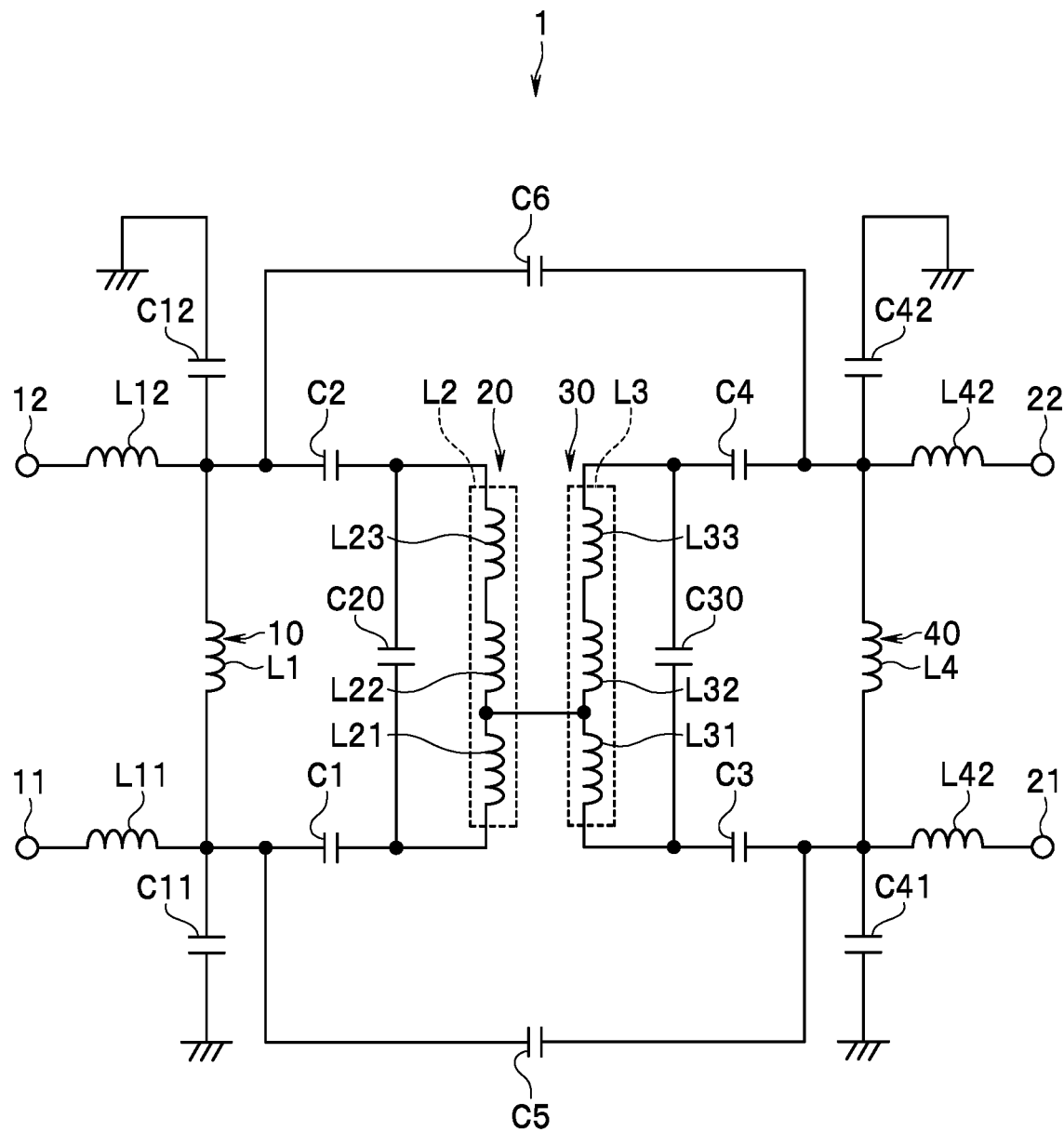
FIG. 19 is a circuit diagram showing a circuit configuration of a filter circuit according to a second embodiment of the present invention.
Figure 20A:
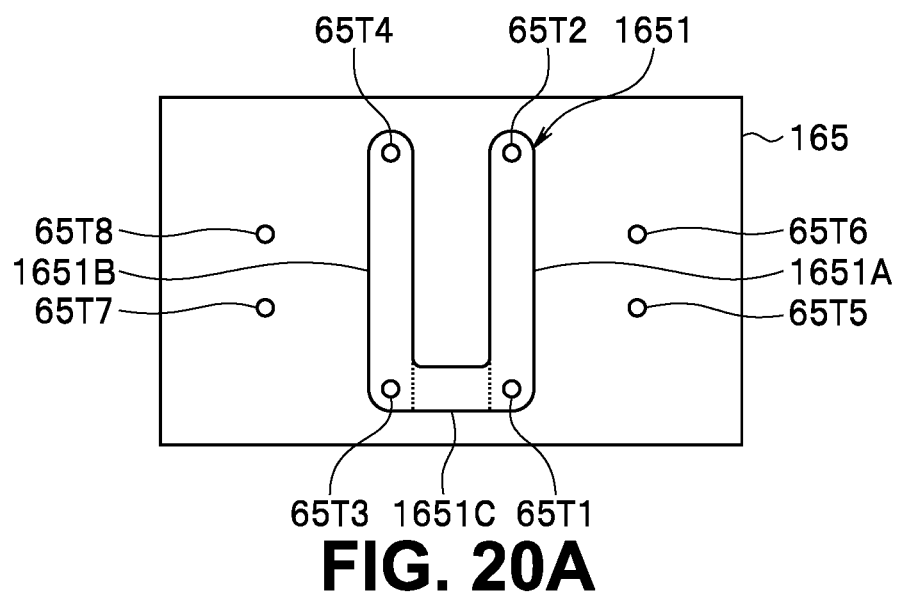
FIG. 20A and FIG. 20B are explanatory diagrams showing respective patterned surfaces of fifteenth and sixteenth dielectric layers of a stack of a multilayered filter device according to the second embodiment of the present invention.
Figure 20B:
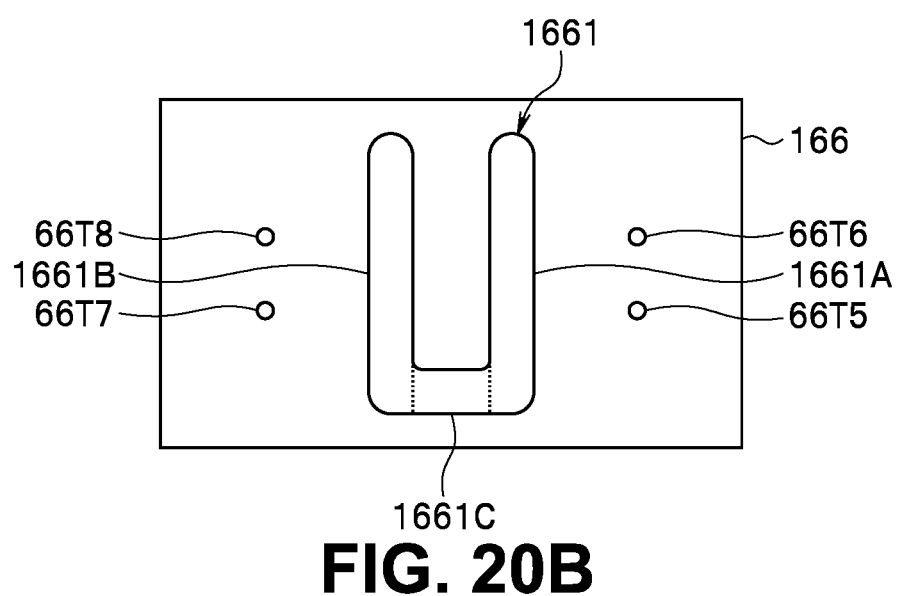
Figure 21:
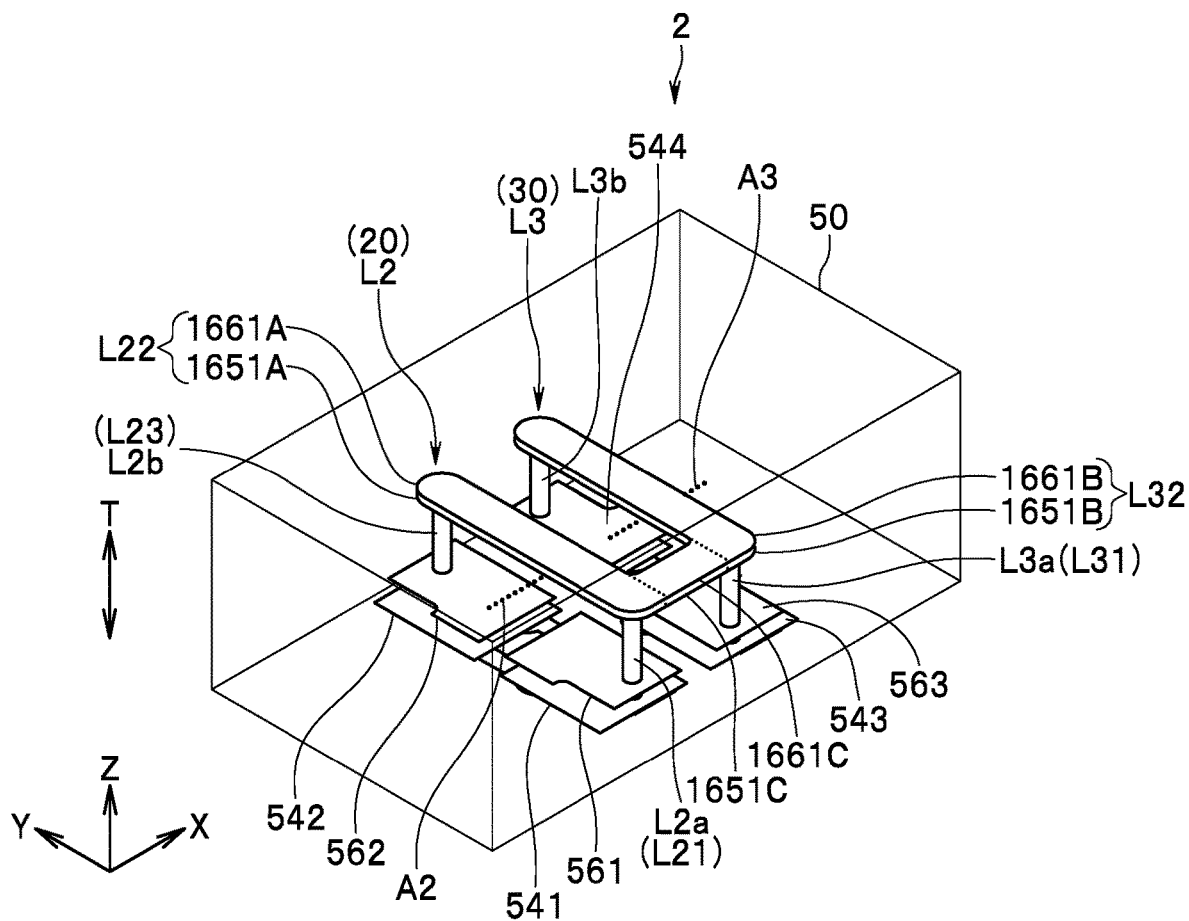
FIG. 21 is a perspective view showing an internal structure of the stack of the multilayered filter device according to the second embodiment of the present invention.

Next, with reference to FIG. 19 to FIG. 21, a second embodiment of the present invention will be described. FIG. 19 is a circuit diagram showing a circuit configuration of a filter circuit according to the present embodiment. FIG. 20A and FIG. 20B are explanatory diagrams showing patterned surfaces of fifteenth and sixteenth dielectric layers of a stack of the filter device according to the present embodiment. FIG. 21 is a perspective view showing an internal structure of the stack of a multilayered filter device according to the present embodiment.

The filter circuit 1 according to the present embodiment is different from that of the first embodiment in the following. In the present embodiment, the inductors L2 and L3 are electrically connected to each other in one aspect of a first aspect in which one end of the second part L22 of the inductor L2 and one end of the second part L32 of the inductor L3 are electrically connected to each other, and a second aspect in which the other end of the second part L22 of the inductor L2 and the other end of the second part L32 of the inductor L3 are electrically connected to each other. In the example shown in FIG. 19, the inductors L2 and L3 are electrically connected to each other in the first aspect.

The filter device 2 according to the present embodiment is different from that of the first embodiment in the following. In the present embodiment, the stack 50 includes fifteenth and sixteenth dielectric layers 165 and 166 instead of the fifteenth and sixteenth dielectric layers 65 and 66 of the first embodiment.

FIG. 20A shows a patterned surface of the fifteenth dielectric layer 165. An inductor conductor layer 1651 is formed on the patterned surface of the dielectric layer 165. The conductor layer 1651 has a U-like shape. The conductor layer 1651 includes a first conductor layer portion 1651A, a second conductor layer portion 1651B, and a first connection portion 1651C. Each of the first and second conductor layer portions 1651A and 1651B has a first end and a second end opposite to each other. The first connection portion 1651C connects a portion of the first conductor layer portion 1651A near the first end thereof and a portion of the second conductor layer portion 1651B near the first end thereof. In FIG. 20A, boundaries between the first and second conductor layer portions 1651A and 1651B and the first connection portion 1651C are indicated with dotted lines.

The length (dimension in the long-side direction) of the first connection portion 1651C is smaller than the length (dimension in the long-side direction) of each of the first and second conductor layer portions 1651A and 1651B.

Through holes 65T1 to 65T8 are formed in the dielectric layer 165, similarly to the dielectric layer 65. The through hole 60T1 formed in the dielectric layer 64 shown in FIG. 6A and the through hole 65T1 are connected to a portion of the first conductor layer portion 1651A near the first end thereof. The through hole 60T2 formed in the dielectric layer 64 and the through hole 65T2 are connected to a portion of the first conductor layer portion 1651A near the second end thereof. The through hole 60T3 formed in the dielectric layer 64 and the through hole 65T3 are connected to a portion of the second conductor layer portion 1651B near the first end thereof. The through hole 60T4 formed in the dielectric layer 64 and the through hole 65T4 are connected to a portion of the second conductor layer portion 1651B near the second end thereof.

FIG. 20B shows a patterned surface of the sixteenth dielectric layer 166. An inductor conductor layer 1661 is formed on the patterned surface of the dielectric layer 166. The conductor layer 661 has a U-like shape. The conductor layer 1661 includes a first conductor layer portion 1661A, a second conductor layer portion 1661B, and a first connection portion 1661C. Each of the first and second conductor layer portions 1661A and 1661B has a first end and a second end opposite to each other. The first connection portion 1661C connects a portion of the first conductor layer portion 1661A near the first end thereof and a portion of the second conductor layer portion 1661B near the first end thereof. In FIG. 20B, boundaries between the first and second conductor layer portions 1661A and 1661B and the first connection portion 1661C are indicated with dotted lines.

The length (dimension in the long-side direction) of the first connection portion 1661C is smaller than the length (dimension in the long-side direction) of each of the first and second conductor layer portions 1661A and 1661B.

The through hole 65T1 formed in the dielectric layer 165 is connected to a portion of the first conductor layer portion 1661A near the first end thereof. The through hole 65T2 formed in the dielectric layer 165 is connected to a portion of the first conductor layer portion 1661A near the second end thereof. The through hole 65T3 formed in the dielectric layer 165 is connected to a portion of the second conductor layer portion 1661B near the first end thereof. The through hole 65T4 formed in the dielectric layer 165 is connected to a portion of the second conductor layer portion 1661B near the second end thereof.

Through holes 66T5, 66T6, 66T7, and 66T8 are formed in the dielectric layer 166, similarly to the dielectric layer 66. The through holes 65T5 to 65T8 formed in the dielectric layer 165 are connected to the through holes 66T5 to 66T8, respectively. The through holes 66T5 to 66T8 are connected to the through holes 67T5 to 67T8 formed in the dielectric layer 67 shown in FIG. 7A, respectively.

In the present embodiment, the first through hole line L2$a$ and the second through hole line L2$b$ of the inductor L2 are connected by the first conductor layer portions 1651A and 1661A. The second part L22 of the inductor L2 is formed of the first conductor layer portions 1651A and 1661A.

The first through hole line L3$a$ and the second through hole line L3$b$ of the inductor L3 are connected by the second conductor layer portions 1651B and 1661B. The second part L32 of the inductor L3 is formed of the second conductor layer portions 1651B and 1661B.

As shown in FIG. 21, the inductors L2 and L3 are connected by the first connection portions 1651C and 1661C. In the present embodiment in particular, the first conductor layer portion 1651A of the inductor L2, the second conductor layer portion 1651B of the inductor L3, and the first connection portion 1651C are formed of one inductor conductor layer 1651. The first conductor layer portion 1661A of the inductor L2, the second conductor layer portion 1661B of the inductor L3, and the first connection portion 1661C are formed of one inductor conductor layer 1661.

The configuration, working and effects of the present embodiment are otherwise the same as those of the first embodiment.

Note that the present invention is not limited to the foregoing embodiments, and various modifications can be made thereto. For example, in the second embodiment, the inductors L2 and L3 may be electrically connected to each other in the second aspect instead of the first aspect. In this case, instead of the first connection portion 1651C, the inductor conductor layer 1651 may include a connection portion connecting a portion of the first conductor layer portion 1651A near the second end thereof and a portion of the second conductor layer portion 1651B near the second end thereof. Similarly, instead of the first connection portion 1661C, the inductor conductor layer 1661 may include a connection portion connecting a portion of the first conductor layer portion 1661A near the second end thereof and a portion of the second conductor layer portion 1661B near the second end thereof.

The resonators 10 and 40 need not be provided. Alternatively, in addition to the resonators 10, 20, 30, and 40, a plurality of resonators may be provided. At least one of the pair of the input inductors L11 and L12 or the pair of the output inductors L41 and L42 need not be provided.

The inductors L2 and L3 may each be formed of inductor conductor layers wound around an axis parallel to the stacking direction T. The inductors L1 and L4, the input inductors L11 and L12, and the output inductors L41 and L42 may each be formed of two through hole lines and conductor layer(s) connecting the two through hole lines.

The filter circuit and the filter device of the present invention may be a balanced filter, other than a band-pass filter, which includes two capacitors corresponding to the capacitors C20 and C30 and two resonators corresponding to the resonators 20 and 30.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A filter circuit comprising:
   a pair of balanced input ports;
   a pair of balanced output ports;
   a first resonator and a second resonator provided in parallel between the pair of balanced input ports and the pair of balanced output ports in a circuit configuration;
   a first capacitor connected in parallel to the first resonator; and
   a second capacitor connected in parallel to the second resonator, wherein
   the first resonator and the second resonator are magnetically coupled to each other and electrically connected to each other,
   the first capacitor and the second capacitor are not electrically connected to ground,
   the first resonator includes a first inductor wound around a first axis, and
   the second resonator includes a second inductor wound around a second axis.

2. The filter circuit according to claim 1, wherein the first resonator and the second resonator are not electrically connected to the ground.

3. The filter circuit according to claim 1, wherein each of the first inductor and the second inductor includes a first part, a second part, and a third part being connected in series, and
   the first inductor and the second inductor are electrically connected to each other in at least one aspect of a first aspect in which one end of the second part of the first inductor and one end of the second part of the second inductor are electrically connected to each other, or a second aspect in which another end of the second part of the first inductor and another end of the second part of the second inductor are electrically connected to each other.

4. The filter circuit according to claim 1, further comprising
   a third resonator provided in parallel to the first resonator, between the pair of balanced input ports and the first resonator in the circuit configuration.

5. The filter circuit according to claim 1, further comprising
   a fourth resonator provided in parallel to the second resonator, between the pair of balanced output ports and the second resonator in the circuit configuration.

6. The filter circuit according to claim 1, further comprising
   two input inductors electrically connected to the pair of balanced input ports.

7. The filter circuit according to claim 1, further comprising
   two output inductors electrically connected to the pair of balanced output ports.

8. The filter circuit according to claim 1, wherein the filter circuit has the circuit configuration in which a part including the pair of balanced input ports and the first resonator in the circuit configuration and a part including the pair of balanced output ports and the second resonator in the circuit configuration are configured to be symmetrical with respect to a center between the first resonator and the second resonator.

9. The filter circuit according to claim 1, wherein the filter circuit has the circuit configuration in which a part including one port of the pair of balanced input ports and one port of the pair of balanced output ports in the circuit configuration and a part including another port of the pair of balanced input ports and another port of the pair of balanced output ports in the circuit configuration are configured to be symmetrical with respect to the first resonator and the second resonator.

10. A multilayered filter device comprising:
    a pair of balanced input terminals;
    a pair of balanced output terminals;
    a first resonator and a second resonator provided in parallel between the pair of balanced input terminals and the pair of balanced output terminals in a circuit configuration;
    a first capacitor connected in parallel to the first resonator;
    a second capacitor connected in parallel to the second resonator; and
    a stack for integrating the pair of balanced input terminals, the pair of balanced output terminals, the first resonator, the second resonator, the first capacitor, and the second capacitor, the stack including a plurality of dielectric layers stacked together, wherein
    the first resonator and the second resonator are magnetically coupled to each other and electrically connected to each other in the stack,
    the first capacitor and the second capacitor are not electrically connected to ground,
    the first resonator includes a first inductor wound around a first axis, and
    the second resonator includes a second inductor wound around a second axis.

11. The multilayered filter device according to claim 10, wherein
    the first resonator and the second resonator are not electrically connected to the ground.

12. The multilayered filter device according to claim 10, wherein
    an opening of the first inductor and an opening of the second inductor face each other.

13. The multilayered filter device according to claim 10, wherein
    each of the first inductor and the second inductor includes a first through hole line, a second through hole line, and a conductor layer portion connecting the first through hole line and the second through hole line, and
    each of the first through hole line and the second through hole line is formed with two or more through holes being connected in series.

14. The multilayered filter device according to claim 13, further comprising
    an inductor conductor layer arranged in the stack, wherein
    the inductor conductor layer includes the conductor layer portion of the first inductor, the conductor layer portion of the second inductor, and a connection portion connecting the conductor layer portion of the first inductor and the conductor layer portion of the second inductor.

15. The multilayered filter device according to claim 10, further comprising
   a third resonator provided in parallel to the first resonator, between the pair of balanced input terminals and the first resonator in the circuit configuration.

16. The multilayered filter device according to claim 15, wherein
   the third resonator includes a third inductor,
   the third inductor includes a third inductor conductor layer arranged in the stack, and
   the third inductor conductor layer is arranged at a position different form the first resonator in a stacking direction of the plurality of dielectric layers.

17. The multilayered filter device according to claim 10, further comprising
   a fourth resonator provided in parallel to the second resonator, between the pair of balanced output terminals and the second resonator in the circuit configuration.

18. The multilayered filter device according to claim 17, wherein
   the fourth resonator includes a fourth inductor,
   the fourth inductor includes a fourth inductor conductor layer arranged in the stack, and
   the fourth inductor conductor layer is arranged at a position different from the second resonator in a stacking direction of the plurality of dielectric layers.

19. The multilayered filter device according to claim 10, further comprising
   two input inductors electrically connected to the pair of balanced input terminals.

20. The multilayered filter device according to claim 10, further comprising
   two output inductors electrically connected to the pair of balanced output terminals.

21. The multilayered filter device according to claim 10, wherein
   a shape and an arrangement of a plurality of conductors constituting a part including the pair of balanced input terminals, the first resonator, and the first capacitor in the stack are symmetrical with a shape and an arrangement of a plurality of conductors constituting a part including the pair of balanced output terminals, the second resonator, and the second capacitor in the stack, with respect to a first imaginary plane passing between the first resonator and the second resonator and being in parallel to a stacking direction of the plurality of dielectric layers.

22. The multilayered filter device according to claim 10, wherein
   a plurality of conductors constituting a part including one terminal of the pair of balanced input terminals and one terminal of the pair of balanced output terminals in the stack are arranged symmetrically with a part including another terminal of the pair of balanced input terminals and another terminal of the pair of balanced output terminals in the stack, with respect to a second imaginary plane crossing the first resonator and the second resonator and being in parallel to a stacking direction of the plurality of dielectric layers.

* * * * *